(12) United States Patent
Iizuki et al.

(10) Patent No.: US 8,675,279 B2
(45) Date of Patent: Mar. 18, 2014

(54) GRATING STRUCTURE FOR DIVIDING LIGHT

(75) Inventors: Hideo Iizuki, Ann Arbor, MI (US); Nader Engheta, Berwyn, PA (US); Yasuhiko Takeda, Aichi (JP)

(73) Assignees: Toyota Motor Engineering and Manufacturing North America, Inc., Erlanger, KY (US); The Trustees of the University of Pennsylvania, Philadelphia, PA (US); Toyota Central Research and Development Laboratories, Inc., Aichi (JP)

( * ) Notice: Subject to any disclaimer, the term of this patent is extended or adjusted under 35 U.S.C. 154(b) by 548 days.

(21) Appl. No.: 12/638,334

(22) Filed: Dec. 15, 2009

(65) Prior Publication Data

US 2011/0139234 A1    Jun. 16, 2011

(51) Int. Cl.
  *G02B 5/18* (2006.01)
(52) U.S. Cl.
  USPC .......................................................... 359/569
(58) Field of Classification Search
  USPC .................................. 359/566, 569, 571, 576
  See application file for complete search history.

(56) References Cited

U.S. PATENT DOCUMENTS

| | | | |
|---|---|---|---|
| 4,314,283 A | 2/1982 | Kramer | |
| 4,377,722 A | 3/1983 | Wested | |
| 4,897,844 A | 1/1990 | Schimpe | |
| 5,420,595 A | 5/1995 | Zhang et al. | |
| 5,696,584 A * | 12/1997 | Franz et al. | 356/521 |
| 6,219,478 B1 | 4/2001 | Parriaux et al. | |
| 6,350,945 B1 | 2/2002 | Mizuno | |
| 6,441,298 B1 | 8/2002 | Thio | |
| 6,762,880 B2 | 7/2004 | Holm et al. | |
| 6,858,462 B2 | 2/2005 | Zaidi et al. | |
| 7,139,128 B2 | 11/2006 | Smith et al. | |
| 7,268,946 B2 | 9/2007 | Wang | |
| 7,319,559 B2 | 1/2008 | Nakama et al. | |
| 7,369,186 B2 | 5/2008 | Momoki | |
| 7,554,734 B1 * | 6/2009 | Holm et al. | 359/576 |
| 2006/0050391 A1 | 3/2006 | Backlund et al. | |
| 2006/0127829 A1 | 6/2006 | Deng et al. | |
| 2006/0127830 A1 | 6/2006 | Deng et al. | |
| 2007/0165307 A1 | 7/2007 | Perkins | |
| 2007/0277869 A1 | 12/2007 | Shan et al. | |
| 2007/0297053 A1 | 12/2007 | Wang | |
| 2008/0055719 A1 | 3/2008 | Perkins et al. | |
| 2008/0055723 A1 | 3/2008 | Gardner et al. | |
| 2008/0074748 A1 | 3/2008 | Kittaka et al. | |
| 2008/0266662 A1 | 10/2008 | Perkins | |
| 2008/0316599 A1 | 12/2008 | Wang | |

OTHER PUBLICATIONS

Kristian Buchwald, Fused Silica Transmission Gratings, Ibsen Photonics (2007), available at: http://www.dops.dk/pictures/pdf/ibsen_whitepaper.pdf.*

(Continued)

*Primary Examiner* — Stephone B Allen
*Assistant Examiner* — Kimberly N Kakalec
(74) *Attorney, Agent, or Firm* — Brinks Gilson & Lione

(57) ABSTRACT

A grating structure and a solar cell assembly. In one aspect, the grating structure suppresses the zero order transmission to near 0%. In another aspect, the solar cell assembly has improved absorption due to coupling with a grating structure.

16 Claims, 18 Drawing Sheets

(56) References Cited

OTHER PUBLICATIONS

T. Clausnitzer, T. Kämpfe, E.-B. Kley and A. Tünnermann, "An intelligible explanation of highly-efficient diffraction in deep dielectric rectangular transmission gratings", Dec. 26, 2005 / vol. 13, No. 26 / Optics Express, pp. 10448-10456.

B. Wang, C. Zhou, S. Wang, and J. Feng, "Polarizing beam splitter of a deep-etched fused-silica grating", © 2007 Optical Society of America, May 15, 2007 / vol. 32, No. 10 / Optics Letters, pp. 1299-1301.

M.G. Moharam and T.K. Gaylor, "Diffraction analysis of dielectric surface-relief gratings", © 1982 Optical Society of America, vol. 72, No. 10 / Oct. 1982 / J. Opt. Soc. Am., pp. 1385-1392.

N. Bonod, G. Tayeb, D. Maystre, S. Enoch, and E. Popov, "Total absorption of light by lamellar metallic gratings", © 1008 OSA, Sep. 29, 2008 / vol. 16, No. 20 / Optics Express, pp. 15431-15438.

M. Shokooh-Saremi and R. Magnusson, "Wideband leaky-mode resonance reflectors: Influence of grating profile and sublayers", © 2008 OSA, Oct. 27, 2008 / vol. 16, No. 22 / Optics Express, pp. 18249-18263.

P. Sheng, R.S. Stepleman, P.N. Sanda, "Exact eigenfunctions for square-wave gratings: Application to diffraction and surface-plasmon calculations", © 1982 The American Physical Society, Physical Review B, vol. 26, No. 6, Sep. 15, 1982, pp. 2907-2917.

T. Clausnitzer, T. Kämpfe, E.-B. Kley, A. Tünnermann, A.V. Tishchenko, and O. Parriaux, "Highly Dispersive dielectric transmission gratings with 100% diffraction efficiency", © 2008 OSA, Apr. 14, 2008 / vol. 16, No. 8 / Optics Express, pp. 5577-5584.

T. Clausnitzer, T. Kämpfe, F. Brückner, R. Heinze, E.-B. Kley, and A. Tunnermann, "Reflection-reduced encapsulated transmission grating", © 1008 OSA, Optics Letters / vol. 33, No. 17 / Sep. 1, 2008, pp. 1972-1974.

N. Takeshima, Y. Narita, and S. Tanaka, "Fabrication of high-efficiency diffraction gratings in glass", © 2005 OSA, Optics Letters / vol. 30, No. 4 / Feb. 15, 2005, pp. 352-354.

D.K. Jacob, S.C. Dunn, and M.G. Moharam, "Interference approach applied to dual-grating dielectric resonant grating reflection filters", © 2001 OSA, Nov. 15, 2001 / vol. 26, No. 22 / Optics Letters, pp. 1749-1751.

J.R. Marciante, D.H. Raguin, "High-efficiency, high-dispersion diffraction gratings based on total internal reflection", © 2004 OSA, Optics Letters / vol. 29, No. 6 / Mar. 15, 2004, pp. 542-544.

L. Li, J. Hirsh, "All-dielectric high-efficiency reflection gratings made with multilayer thin-film coatings", © 1995 OSA, Jun. 1, 1995 / vol. 20, No. 11 / Optics Letters, pp. 1349-1351.

M. Foresti, L. Menez, A.V. Tishchenko, "Modal method in deep metal-dielectric gratings: the decisive role of hidden modes", © 2006 OSA, vol. 23, No. 10 / Oct. 2006 / J. Opt. Soc. Am. A, pp. 2501-2509.

J. Zheng, C. Zhou, J. Feng, and B. Wang, "Polarizing beam splitter of deep-etched triangular-groove fused-silica gratings", © 2008 SA, Optics Letters / vol. 33, No. 14 / Jul. 15, 2008, pp. 1554-1556.

A.L. Fehrembach, A. Talneau, O. Boyko, F. Lemarchand, and A. Sentenac, "Experimental demonstration of a narrowband, angular tolerant, polarization independent, doubly periodic resonant grating filter", © 2007 OSA, Aug. 1, 2007 / vol. 32, No. 15 / Optics Letters, pp. 2269-2271.

M. Shokooh-Saremi and R. Magnusson, "Particle swarm optimization and its application to the design of diffraction grating filters", © 2007 OSA, Optics Letters / vol. 32, No. 8 / Apr. 15, 2007, pp. 894-896.

K.Y. Fong and P.M. Hui, "Controlling enhanced transmission through metallic gratings with subwavelength slits by anistropic waveguide resonance", © 2007 American Institute of Physics, Applied Physics Letters 91, (2007), pp. 171101-1 to 171101-3.

C. Cheng, J. Chen, Q.Y. Wu, F.F. Ren, J. Xu, "Controllable electromagnetic transmission based on dual-metallic grating structures composed of subwavelength slits", © 2007 American Institute of Physics, Applied Physics Letters 91, (2007), pp. 111111-1 to 111111-3.

X. Zhang, S. Feng, H. Liu, and L. Wang, "Enhanced optical response in doubly waveguided plasmonic gratings", © 2008 American Institute of Physics, Applied Physics Letters 93, (2007), pp. 093113-1 to 093113-3.

L. Li, "Multilayer modal method for diffraction gratings of arbitrary profile, depth, and permittivity", © 1993 OSA, vol. 10, No. 12 / Dec. 1993 / J. Opt. Soc. Am. A, pp. 2581-2591.

S.T. Peng, "Rigorous formulation of scattering and guidance by dielectric grating waveguides: general case of oblique incidence", © 1989 OSA, vol. 6, No. 12 / Dec. 1989 / J. Opt. Soc. Am. A, pp. 1969-1883.

S.T. Peng, T. Tamir, and H. L. Bertoni, "Theory of Periodic Dielectric Waveguides", IEEE Transactions on Microwave Theory and Techniques, vol. Mtt-23, No. 1, Jan. 1975, pp. 123-133.

M.G. Moharam and T.K. Gaylord, "Rigorous coupled-wave analysis of planar-grating diffraction", © 1981 OSA, vol. 71, No. 7 / Jul. 1981 / J. Opt. Soc. Am., pp. 811-818.

Coves, B. Gimeno, J. Gil, M.V. Andrés, A.A. San Blas, and V.E. Boria, "Full-Wave Analysis of Dielectric Frequency-Selective Surfaces Using a Vectorial Modal Method", © 2004 IEEE Transactions on Antennas and Propagation, vol. 42, No. 8, Aug. 2004, pp. 2091-2099.

S.T. Peng, T. Tamir, and H. Bertoni, "Correction to 'Theory of Periodic Dielectric Waveguides'", IEEE Transactions on Microwave Theory and Techniques, Aug. 1976.

T. Tamir and S. Zhang, "Modal Transmission-Line Theory of Multilayered Grating Structures", Journal of Lightwave Technology, vol. 14, No. 5, May 1996, pp. 914-927.

A.V. Tishchenko, "Phenomenological representation of deep and high contrast lamellar gratings by means of the modal method", © Springer 2005, Optical and Quantum Electronics (2003) 37:309-330.

R.C. Hall, R. Mittra, K.M. Mitzner, "Analysis of Multilayered Periodic Structures Using Generalized Scattering Matrix Theory", © 1988 IEEE Transactions on Antennas and Propagation, vol. 36, No. 4, Apr. 1988, pp. 511-517.

I.C. Botten, M.S. Craig, R.C. McPhedran, J.L. Adams, J.R. Andrewartha, "The Dielectric Lamellar Diffraction Grating", Journal of Modern Optics, 28:3, pp. 413-426, Mar. 1, 1981.

J.Y. Suratteau, M. Cadilhac, R. Petit, "Sur La Détermination Numérique Des Efficacités De Certains Réseaux Diélectriques Profonds", J. Optics (Paris), 1983, vol. 14, No. 6, pp. 273-288.

J.R. Andrewartha, G.H. Derrick, R.C. McPhedran, "A Modal Theory Solution to Diffraction from a Grating with Semi-circular Grooves", Journal of Modern Optics, 1981, vol. 28, No. 9, pp. 1177-1193.

L. Li, "A modal analysis of lamellar diffraction gratings in conical mountings", Journal of Modern Optics, 1993, vol. 40, No. 4, pp. 553-573.

L. Zeng, et al., "Efficiency enhancement in Si solar cells by textured photonic crystal back reflector," Appl. Phys. Lett., 89, 111111 (2006).

C. Heine and R. H. Morf, "Submicrometer gratings for solar energy applications," Appl. Opt. 34, 2476 (1995).

"Think GAIA for Life and the Earth Bifacial Photovoltaic Module," © Sanyo Energy (U.S.A.) Corp., Sep. 1, 2008, 2 pgs.

MSK Solar Design Line™, See Thru™, "Photovoltaic Glazing Clean Power from Glass," 2 pgs.

* cited by examiner

GRATING STRUCTURE FOR DIVIDING LIGHT

BACKGROUND

1. Field of the Invention

The application generally relates to a grating structure for dividing light.

2. Description of Related Art

Various grating structures have been introduced in industry. Gratings typically have rows of grating lines that diffract light. The diffracted light is generally distributed into a diffraction pattern forming a number of diffraction orders. One type of diffraction grating is a transmission grating. Typically, transmission gratings comprise grooves etched into a transparent material. As the elements of light in the incident spectrum strike the grooves, they are diffracted and, therefore, separated to various degrees.

SUMMARY

One aspect of the application provides an improved grating structure for splitting light.

In solar cell applications, the absorption layer has the highest absorption efficiency when light travels horizontally or in plane with the absorption layer. To facilitate horizontal travel of the light that is received normal to the absorption layer, a grating may be used in conjunction with the absorption layer to diffract the light to be more in plane with the absorption layer. However, for a typical transmission grating most of the light travels through the grating in the zero order transmission. As such, a grating can be designed to suppress the zero order transmission, thereby redirecting the light energy to the first or higher order transmission at higher diffraction angles.

In one configuration, the grating structure includes alternating ridges and grooves. The ridges and grooves are configured such that the angle of the first order transmission is at least 40 degrees, for example about 50 degrees.

In another aspect, the zero mode amplitude contribution and the first mode amplitude contribution may be approximately the same magnitude and 180 degrees out of phase.

Further objects, features and advantages of this invention will become readily apparent to persons skilled in the art after a review of the following description, with reference to the drawings and claims that are appended to and form a part of this specification.

DETAILED DESCRIPTION

Figure 1:
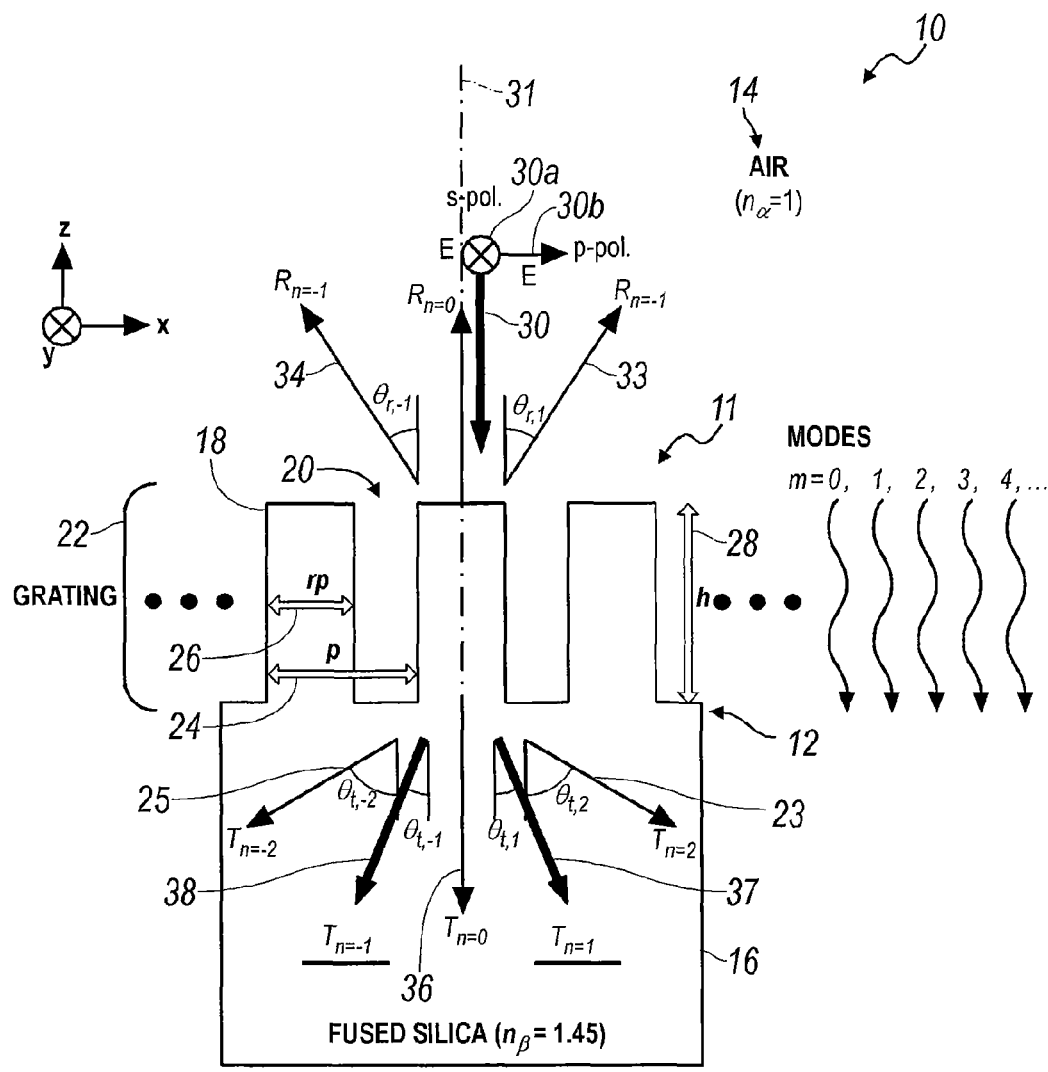
FIG. 1 is a side view of a transmission grating.

Referring to FIG. 1, a system 10 including a transmission grating 11 is provided. The transmission grating 11 may be a fused silica transmission grating with a silica to air interface. As such, air surrounds a silica structure 12 and is denoted by reference number 14. The silica structure 12 includes a base 16 of solid fused silica. Fused silica is very transparent and transmits a very broad bandwidth of light. Further, fused silica offers a very stable material that can be used over a wide range of temperature conditions. In addition, fused silica gratings may be easily etched to provide the grating properties required for many applications. Fused silica has an index of refraction of about 1.45 in contrast to air with an index of refraction of about 1. The symbol $n_\alpha$ is used to denote the refraction index of air and $n_\beta$ is used to denote the refraction index for fused silica. For the gratings and applications described herein, the incident light considered is generally in the range of λ=350 nm to 1600 nm. However, particular cases may be considered for enhancement of blue, green, and red colors, at λ=450 nm, 550 nm, and 700 nm, or for coupling applications at λ=1550 nm.

Figure 2:
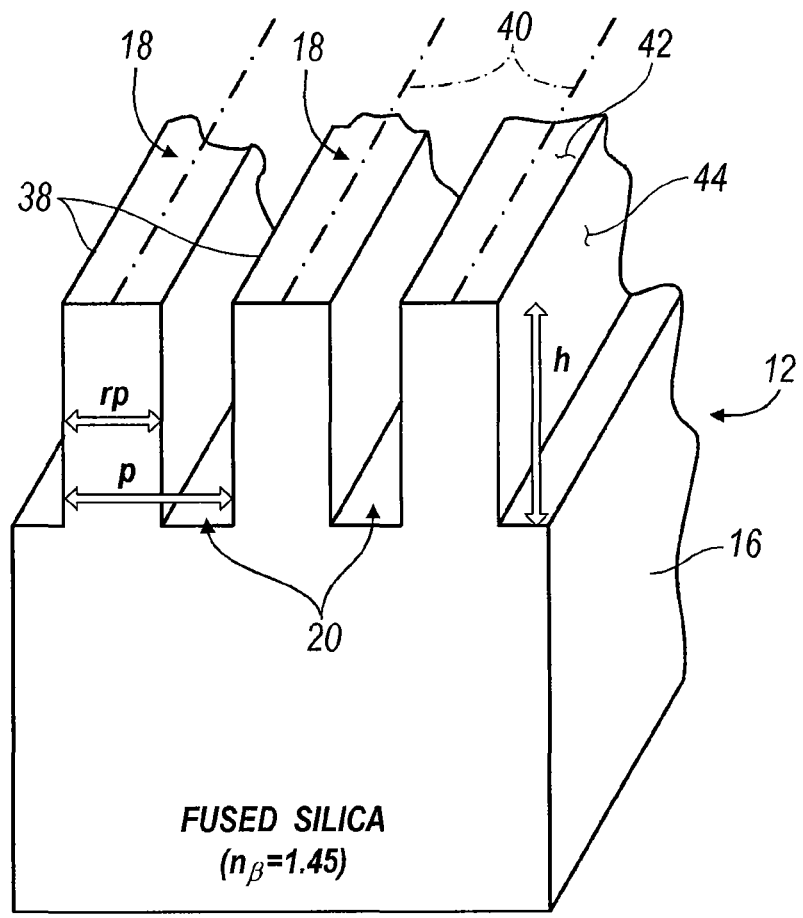
FIG. 2 is a perspective view of a transmission grating.

Protrusions 18 extend from and are integral with the base 16. Being integral with the base 16 the protrusions 18 are also formed of fused silica. The protrusions 18 form grooves 20 located between each protrusion 18. The grooves 20 may be filled with air 14, thereby providing an air fused silica interface across the grating layer 22. The grating layer 22 diffracts light directed towards the transmission grating 11 from a light source into various diffraction orders. Each of the protrusions 18 may form a ridge 39 that extends to provide a uniform line structure, as denoted by lines 40 in FIG. 2. The protrusions 18 may have a top surface 42 and side surfaces 44. The side surfaces 44 may have various profiles or may be substantially straight and form a right angle with the top surfaces 42.

Referring again to FIG. 1, light may be provided to the transmission grating 11, as denoted by arrow 30. For the systems described herein, the light 30 has an angle that is substantially parallel to the principle axis 31 of the grating projections 18. In addition, the incident light 30 may comprise various light polarizations. For example, the incident light may comprise components that are s-polarized 30A and components that are p-polarized 30B. S-polarization denotes when the electrical field is perpendicular to the plane of light propagation. P-polarization denotes where the electrical field is parallel to the plane of light propagation. When the incident light 30 interacts with the grating layer 22, the incident light 30 will form reflective components denoted by R and transmissive components denoted by T.

The reflective components may form a diffraction pattern comprised of a plurality of diffraction orders. For example, the zero order diffraction of the reflective component $R_{n=0}$ is denoted by arrow 32. Similarly, the first order diffraction of the reflective component $R_{n=1}$ is denoted by arrow 33 and the $-1^{st}$ order diffraction of the reflective component $R_{n=-1}$ is denoted by arrow 34. The angle for the $-1^{st}$ order diffraction is $\theta_{r,-1}$, while the angle for the first order diffraction is $\theta_{r,1}$.

The transmissive components may also form a diffraction pattern comprised of a plurality of modes. For example, the zero order diffraction of the transmissive component $T_{n=0}$ is denoted by arrow 36. Similarly, the first order diffraction of the transmissive component $T_{n=1}$ is denoted by line 37 and the $-1^{st}$ order diffraction of the transmissive component $T_{n=-1}$ is denoted by line 38. The second order diffraction of the transmissive component $T_{n=2}$ is denoted by line 23 and the $-2^{nd}$ order diffraction of the transmissive component $T_{n=-2}$ is denoted by line 25. The angle for the $-1^{st}$ order diffraction is $\theta_{t,-1}$, while the angle for the $1^{st}$ order diffraction is $\theta_{t,1}$. Similarly, the angle for the $-2^{nd}$ order diffraction is $\theta_{t,-2}$, while the angle for the $2^{nd}$ order diffraction is $\theta_{t,2}$.

The resulting characteristics of the reflective and transmissive components are a factor of the refractive index (n) of the material, the period (p) of the grating, the fill factor (r) of the grating, and the height (h) of the grating. The period of the grating is the distance from the start of one groove to the start of the next groove. The period of the transmission grating 11 is denoted by reference numeral 24. The fill factor (r) can be defined as the ratio of the ridge width or groove width to the period of the grating, which is denoted by reference numeral 26. The height (h) of the grating is the distance from the top of the protrusion 18 to the bottom of the groove 20, which is denoted by reference numeral 28 in FIG. 1. In one embodiment, the grating may be a rectangular grating having rectangular grooves and ridges. However one would readily understand, that in other embodiments the grooves 20 and protrusions 18 may not form exact right angles and various profiles may be used along the edge 42 of the protrusions 18. As such, the definition for the fill factor (r) or grating height (h) may be slightly modified depending on the shape of the projections 18 and grooves 20. As such, these values may be determined based on the center of gravity of the projections 18 and grooves 20.

The light path formed by the transmission grating 11 having an interface of air/fused silica may be analyzed by modal analysis. The modal analysis can be derived to provide simultaneously a high efficiency for the +/−1st order transmission and suppressed transmission to the zero order diffraction. The amplitude contribution of each mode to the zero order transmission can be used to select the fill factor of the grating. The diffraction efficiency of each diffraction order may then be used to select the groove height. The grating structure fulfilling this condition may exhibit a transmittance for normal light above 90% at an angle of more than 40°.

With regard to analysis methods, rigorous coupled-wave analysis has an advantage of accommodating various groove shapes. Several shapes of grooves such as semi-circle, rectangular, triangular, and curved surfaces can be used. Coupled-wave analysis is typically used for designing gratings, but due to various assumptions this method would not identify the described parameters. Coupled-wave analysis is a numerical analysis and does anticipate propagation mode and evanescent mode integration. On the other hand, a modal analysis can provide a physical insight of diffraction phenomena, although it has less flexibility to adapt for various groove shapes.

When gratings are used for unpolarized light such as light emitting diodes (LEDs), both p-polarization and s-polarization should be simultaneously taken into account in the design. Particularly, the use of $-1^{st}$ and $1^{st}$ order transmission extends the design degrees of freedom for optical devices, components, and assembled systems due to large bending of light for trapping light in the substrate.

However according to the method described herein, a rectangular grating may be derived through a modal analysis to provide simultaneously a high transmittance for the first order transmission and a very low transmittance for the zero order transmission. The analysis can identify a fill factor that produces a substantially equal amplitude contribution to the zero order transmission by the zero mode and another mode. This allows a grating height to be selected that produces a cancelling effect between the zero mode and the other mode with a substantially equal amplitude contribution.

The grating 11 may be coupled to an absorption layer to form a solar cell assembly. As such, the grating 11 may redirect the light to propagate horizontally within the absorption layer to increase absorption. Further, another grating having similar properties to grating 11 may be coupled to the opposite side of the absorption layer thereby redirecting light transmitted toward the opposite side of the absorption layer horizontally within the absorption layer.

Figures 3A, 3B:
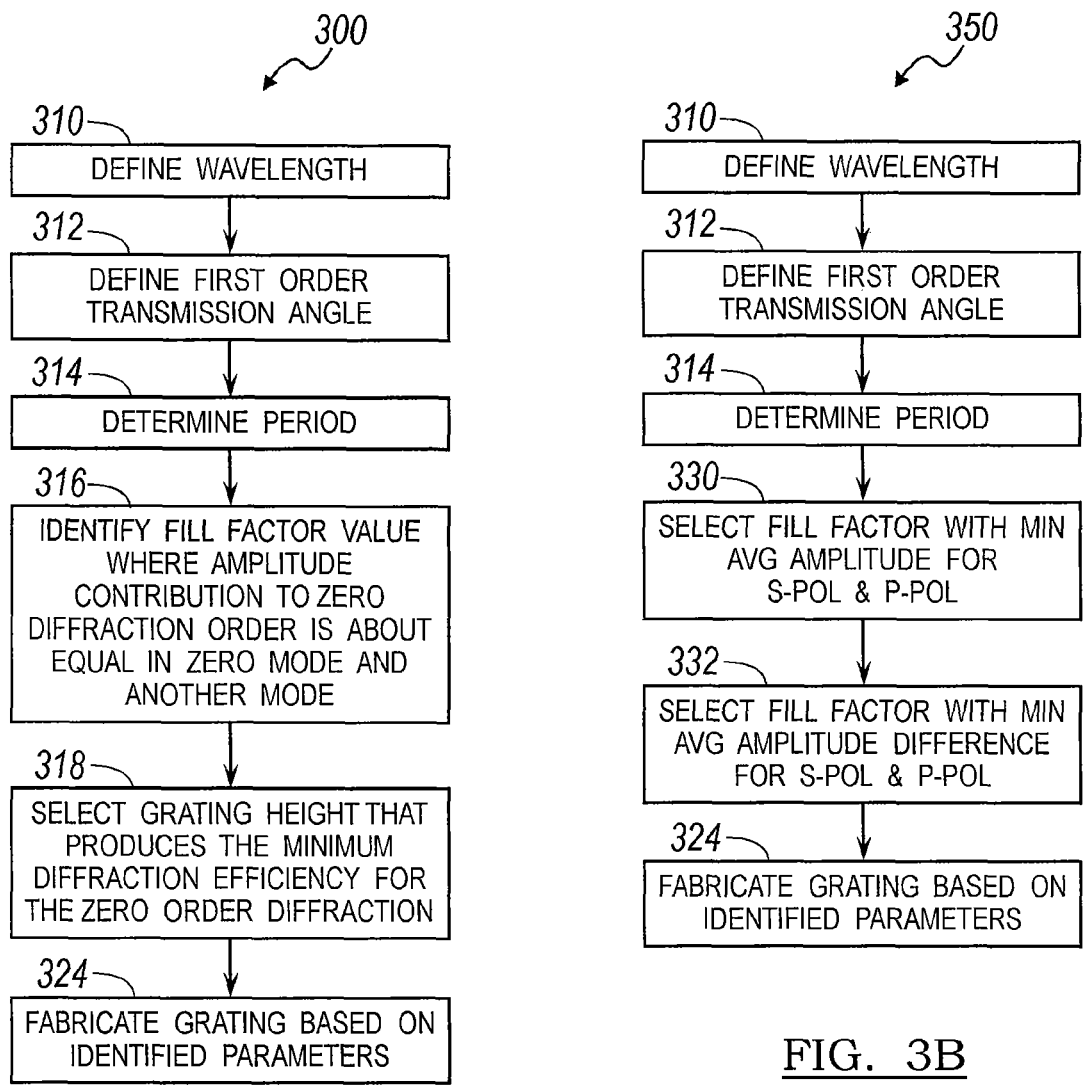
FIGS. 3a and 3b are flow charts illustrating a method for producing a grating.
Figure 5:
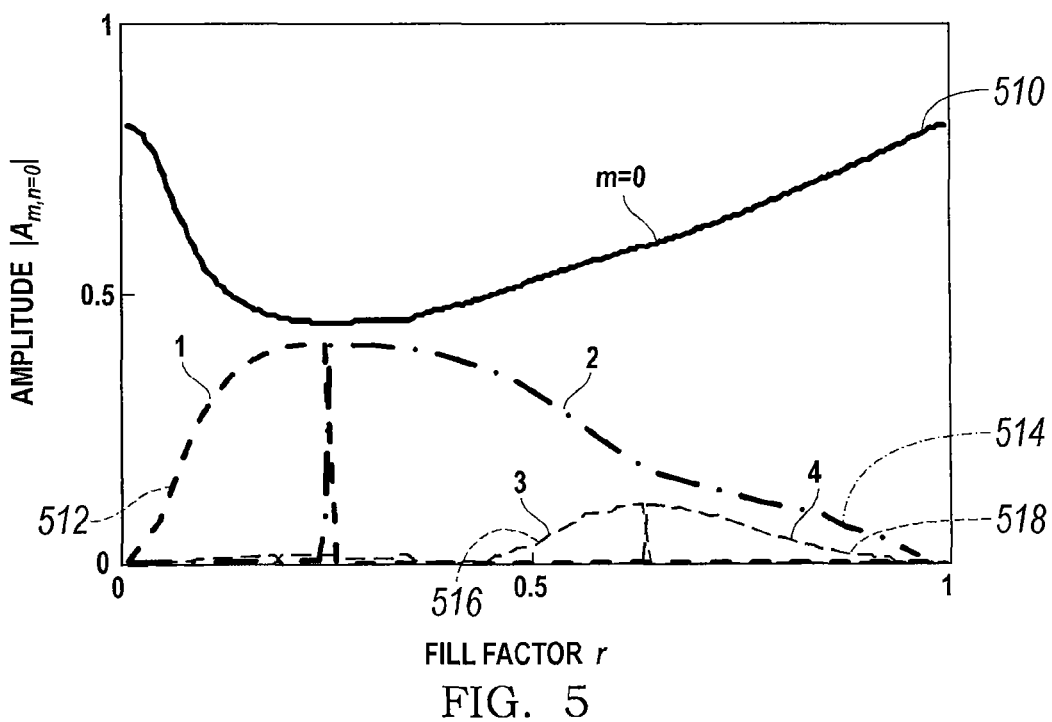
FIG. 5 is a graph illustrating the amplitude contribution for each mode to the zero order transmission with respect to the fill factor of the grating.
Figure 8:
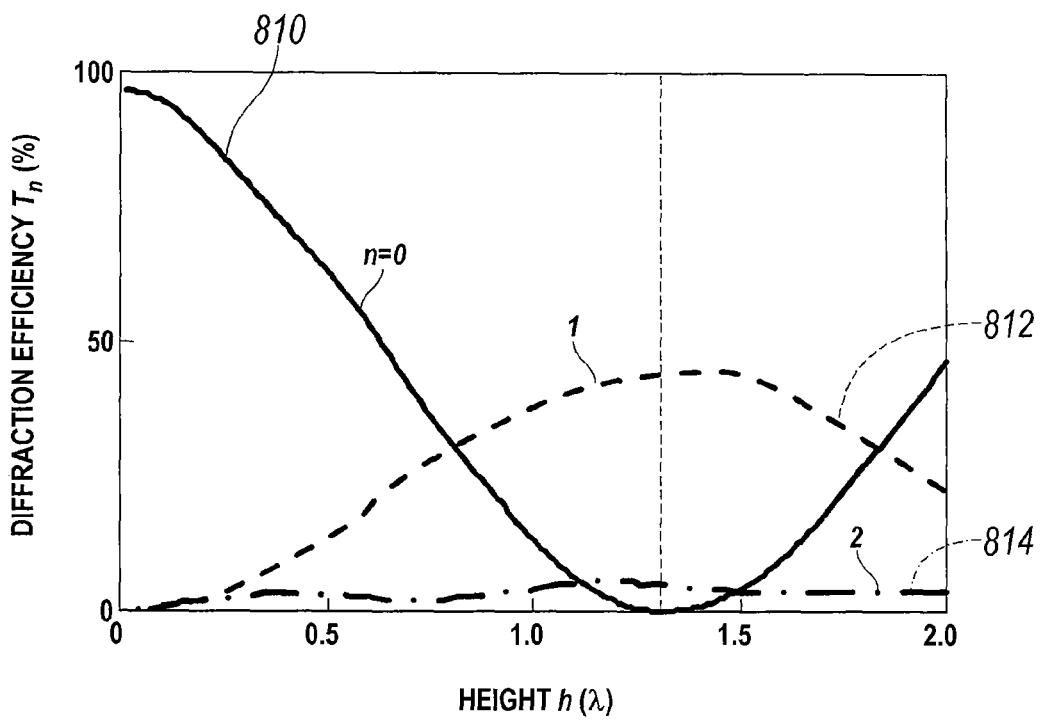
FIG. 8 is a graph illustrating the diffraction efficiency for the zero, first, and second order transmission with respect to the grating height.

Referring to FIG. 3a, a method for producing a grating according to one embodiment is provided in process 300. In block 310, the wavelength range of light is defined. Further, the angle of incident light is defined as being normal to the grating. In block 312, the angle of required diffraction angle is defined, for example a first order transmission angle 50 degrees. In block 314, the period of the grating is defined based on the required diffraction angle and the design wavelength. In block 316, the amplitude contribution for each mode to the zero order transmission is analyzed to identify a fill factor value where the amplitude contribution of the zero mode is about equal to the amplitude contribution of another mode, for example the first mode, as shown in FIG. 5. In block 318, the diffraction efficiency is analyzed for each diffraction order with respect to grating height at the selected fill factor. This can be used to control the phase relationship between the modes. The grating height is selected that produces the minimum diffraction efficiency in the zero order transmission, as shown in FIG. 8. This generally corresponds to mode 0 and mode 1 being 180 degrees out of phase. In block 324, a grating may be fabricated, for example by etching, based on the parameters determined in the above noted steps.

Figure 11:
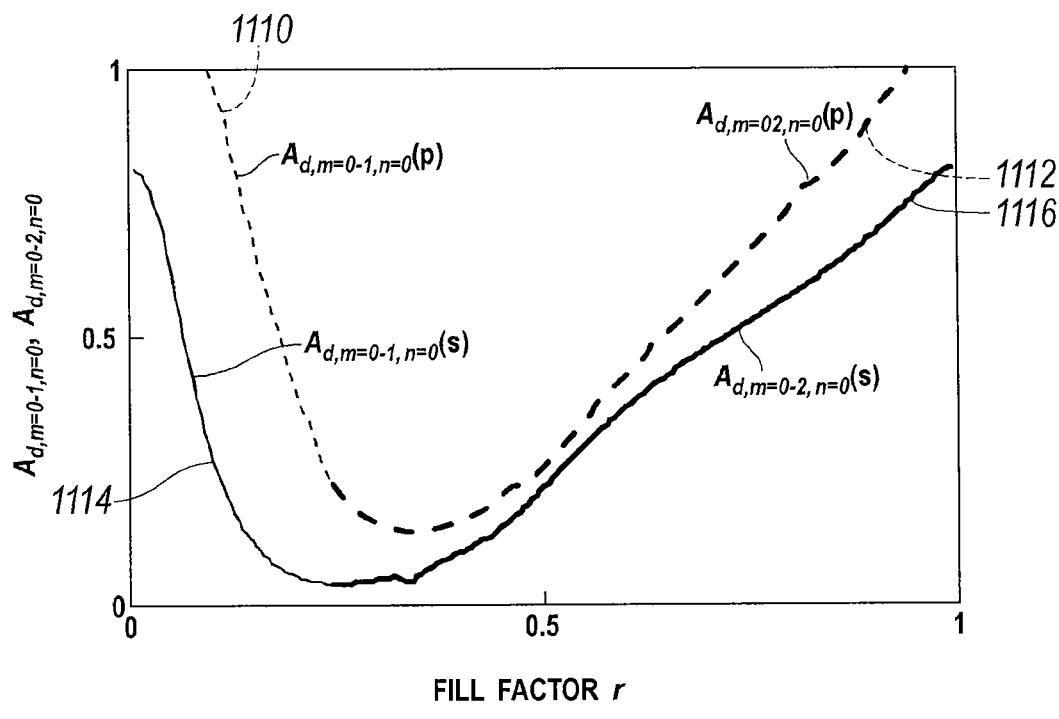
FIG. 11 is a graph illustrating the difference of amplitude contribution to the zero order transmission between the zero mode and the first or between the zero mode and second mode with respect to the fill factor of the grating.
Figure 13:
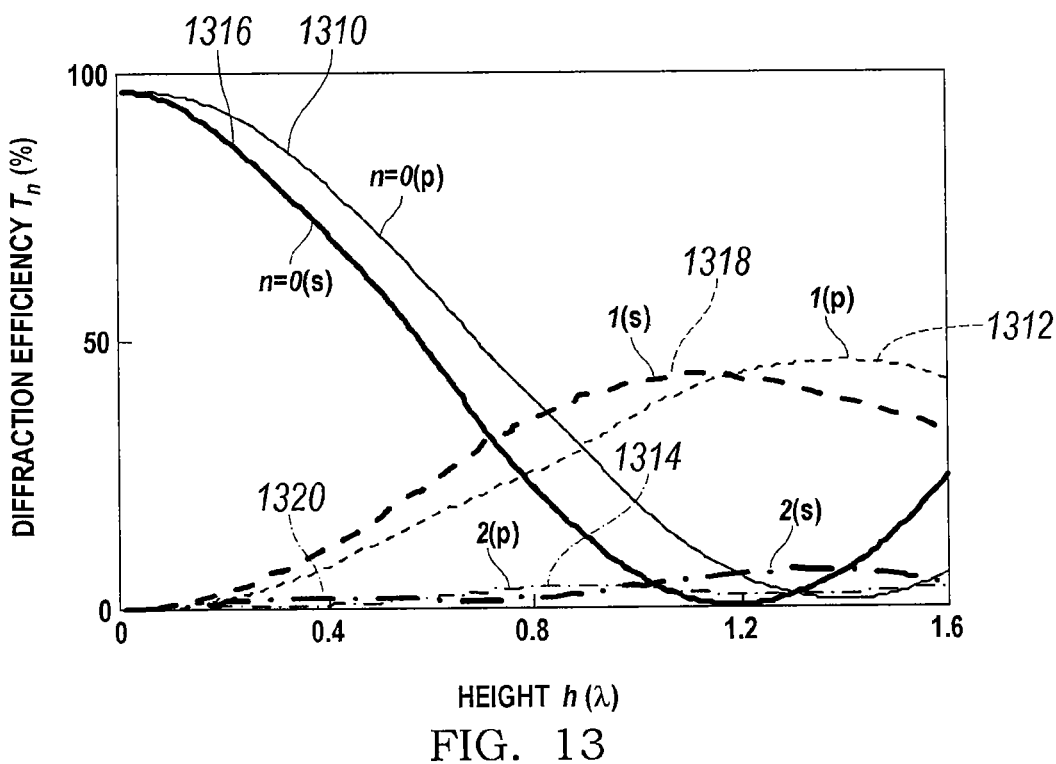
FIG. 13 is a graph illustrating the diffraction efficiency of each diffraction order for s-polarization and p-polarization with respect to grating height.

Referring to FIG. 3b, a method for producing a grating according to one embodiment is provided in process 350. In block 310, the wavelength range of light is defined. Further, the angle of incident light is defined as being normal to the grating. In block 312, the angle of required diffraction angle is defined, for example a first order transmission angle 50 degrees. In block 314, the period of the grating is defined based on the required diffraction angle and the design wavelength. In block 330, the fill factor is selected by analyzing the difference in amplitude contribution to the zero order transmission between the zero mode and the other modes for both s-polarization and p-polarization. As discussed above, the fill factor may be selected to provide the same amplitude contribution for the zero mode and first mode. Then the phase shift between the zero mode and first mode can be controlled to minimize zero order transmission. As such, a fill factor is selected with a minimum average amplitude difference between the zero mode and another mode (e.g. first mode) for both s-polarization and p-polarization, as shown in FIG. 11. In block 332, the grating height is selected that produces the minimum average diffraction efficiency in the zero order transmission for the s-polarization and p-polarization, as shown in FIG. 13. In block 324, a grating may be fabricated, for example by etching, based on the parameters determined in the above noted steps.

Figure 4:
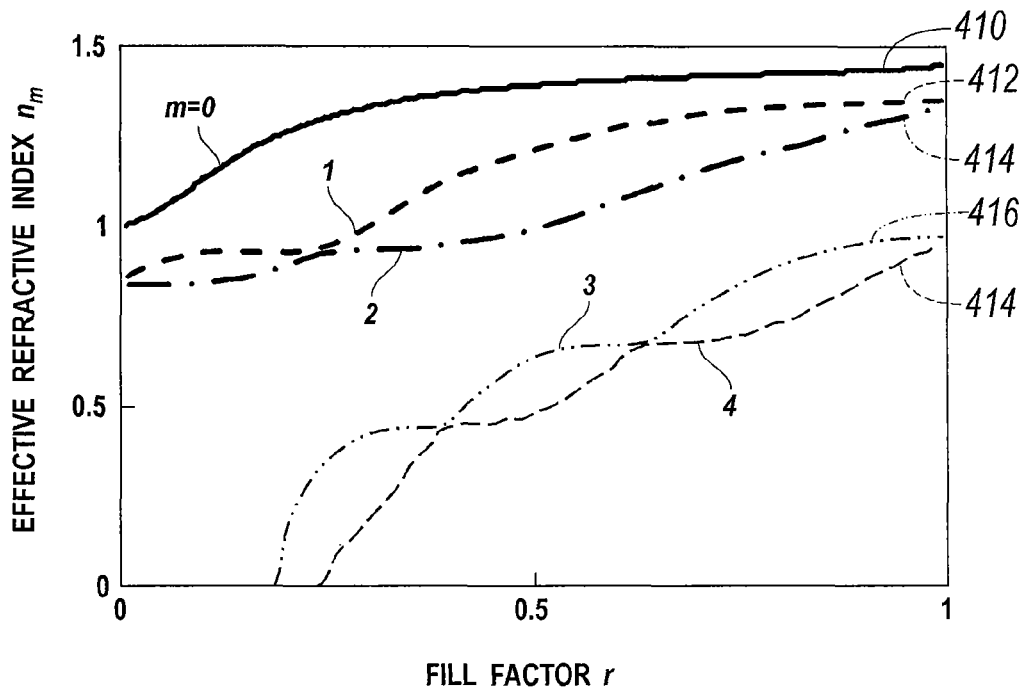
FIG. 4 is a graph illustrating effective refractive index for each mode of light with respect to the fill factor of the grating.

Now referring to FIG. 4, a graph is provided of the effective refractive index for each mode with respect to the fill factor of the grating. Line 410 indicates the effective refractive index for mode 0 based on the fill factor of the grating. Line 412 is the effective refractive index for the first mode with respect to the fill factor. Line 414 is the effective refractive index for the second mode with respect to the fill factor. Similarly, line 416 is the effective refractive index for the third mode, while line 418 is the effective refractive index for the fourth mode with respect to the fill factor. Each line indicates the real portion of the effective refractive index which implies that power can be transferred through that mode for the given fill factor.

FIG. 5 shows the amplitude for each mode that contributes to the zero order transmission according to the fill factor of the grating. Line 510 is the zero mode amplitude contribution to the zero order transmission according to the fill factor. Line 512 is the first mode amplitude contribution to the zero order transmission based on the fill factor. Line 514 is the second mode amplitude contribution to the zero order transmission based on the fill factor. Similarly, line 516 is the third mode transmission and line 518 is the fourth mode amplitude contribution to the zero order transmission based on the fill factor. In looking at FIG. 5, it is important to understand that regardless of the amplitude for each mode, the phase of each mode relative to one another can be controlled by the grating height. Accordingly, if the zero mode and another mode have the same amplitude value the transmission to the zero order (n=0) can be suppressed by selecting a fill factor such that the amplitude of two modes are approximately equal, then the modes can be manipulated so that they are 180° out of phase. As such, the contribution from each mode cancels thereby suppressing the amount of light in the zero order transmission which corresponds to the normal direction. If the light is suppressed in the zero order transmission, by definition the light is transmitted to the other orders, thereby maximizing the amount of light that is transmitted at an angle corresponding to the first order transmission and above. In this scenario, the first mode is approximately equal to the zero mode just below a fill factor of 0.25. Similarly, mode two is approximately equal to mode 0 at a fill factor just above 0.25.

Figure 6:
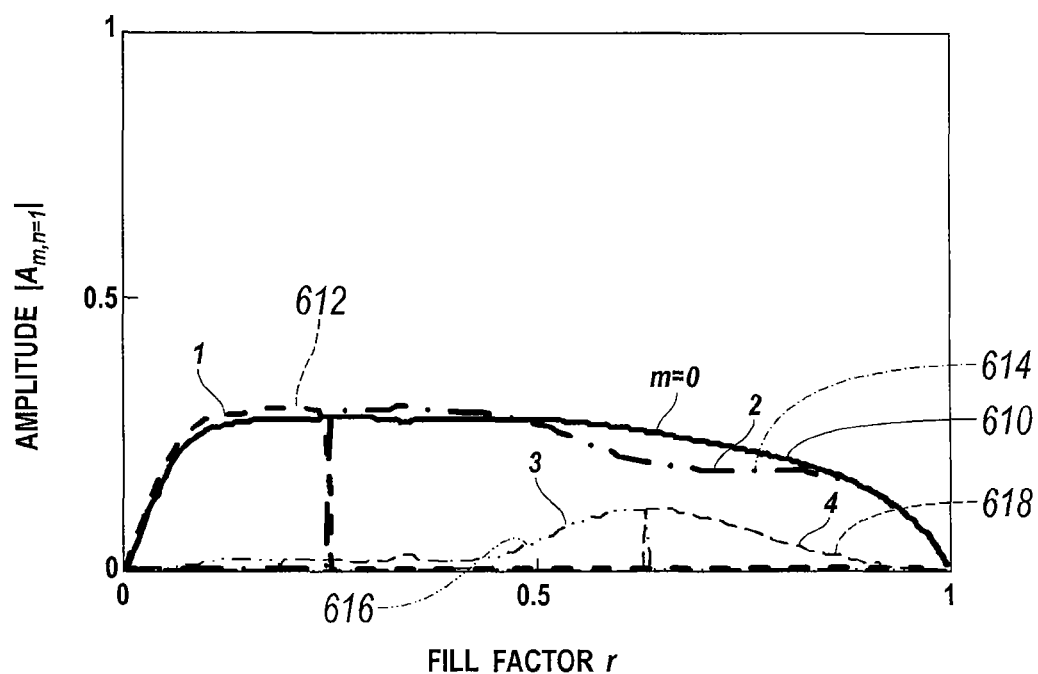
FIG. 6 is a graph illustrating the amplitude contribution for each mode to the first order transmission with respect to the fill factor of the grating.

FIG. 6 illustrates the amplitude of each mode's contribution to the first order transmission. As such, line 610 is the amplitude contribution of the zero mode to the first order of transmission based on the fill factor of the grating. Similarly, line 612 is the first mode amplitude contribution to the first order transmission based on the fill factor. Line 614 is the second mode amplitude contribution to the first order transmission according to the fill factor. Similarly, line 616 is the third mode and line 618 is the fourth mode amplitude contribution to the first order transmission according to the fill factor. In this case, the amplitude of the first order transmission is necessarily enhanced by the suppression of the zero order transmission.

Figure 7:
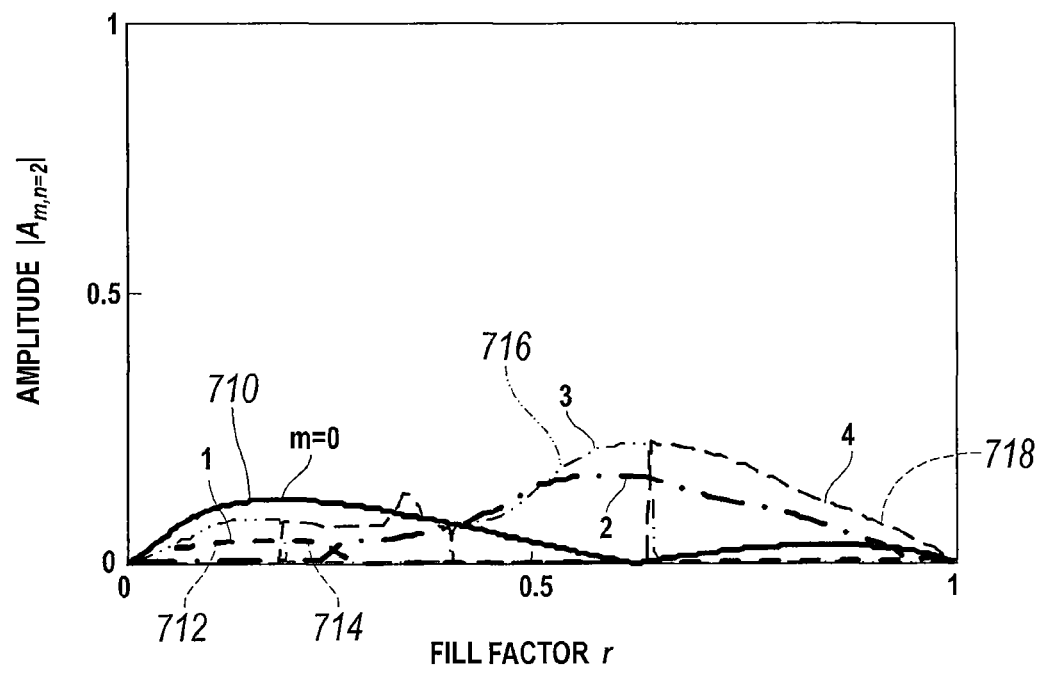
FIG. 7 is a graph illustrating the amplitude contribution for each mode to the second order transmission with respect to the fill factor of the grating.

FIG. 7 illustrates the amplitude of each mode's contribution to the second order transmission. As such, line 710 is the amplitude contribution of the zero mode to the second order of transmission based on the fill factor of the grating. Similarly, line 712 is the first mode amplitude contribution to the second order transmission based on the fill factor. Line 714 is the second mode amplitude contribution to the second order transmission according to the fill factor. Similarly, line 716 is the third mode and line 718 is the fourth mode amplitude contribution to the second order transmission according to the fill factor. Under a fill factor of 0.5, the second order transmission and above is quite small and has a minimal affect on the grating design. Particularly in the case of a photocell where an increased transmission angle will increase the absorption of the photocell.

Now referring to FIG. 8, a graph is provided of the diffraction efficiency for each order of transmission with regard to the height of the grating. Line 810 is the diffraction efficiency of the zero order transmission according to the grating height. Line 812 is the diffraction efficiency of the first order transmission based on the height of the grating. Further, line 814 is the diffraction efficiency of the second order transmission based on the height of the grating. The graph in FIG. 8 is based on a fill factor of 0.25, where the zero mode amplitude contribution to the zero order transmission is approximately equal to the first mode contribution to the zero order transmission. As such, it can be seen that the zero order transmission is approximately equal to 0 at a grating height of about 1.35λ. Further, it can be seen that the first order transmission denoted by line 812 is maximized at about the same value. While the second order transmission 814 varies based on the height, it remains a comparatively small value with respect to the diffraction efficiency of the first order transmission of the grating.

Figure 9:
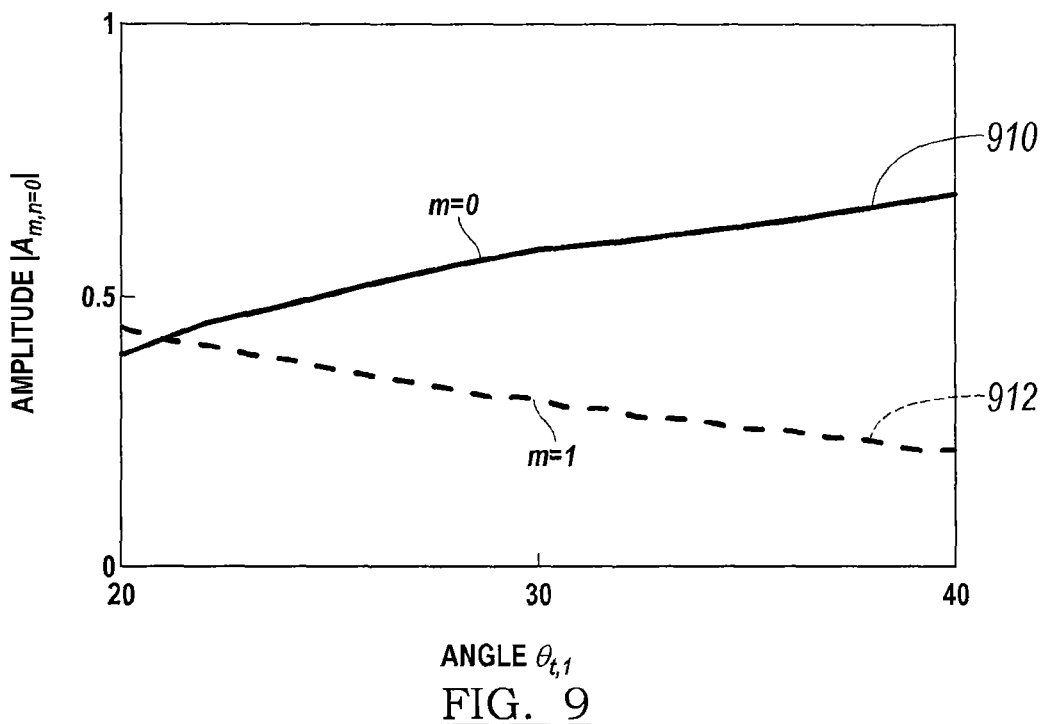
FIG. 9 is a graph illustrating the amplitude contribution for the zero mode and first mode to the zero transmission with respect to the angle of the first order transmission.

FIG. 9 shows the amplitude contribution of each mode to the zero order transmission based on the angle of incidence relative to the grating. In this instance, an angle of 0 would be normal to the grating surface. Line 910 represents the minimum amplitude contribution of the zero mode to the zero order transmission. Similarly, line 912 illustrates the maximum amplitude contribution of the first mode to the zero order transmission based on the angle of incidence. As noted with regard to FIG. 5, ideally the zero mode amplitude contribution to the zero order transmission would be approximately equal to either the first or second mode amplitude contribution to the zero order transmission. As such, the phases of the first or second mode could be manipulated to cancel out the zero mode contribution. However, the amplitude of the zero mode increases while the amplitude of the first mode decreases as the angle of the first order transmission increases. This implies that it is hard to suppress the normal direction of light where n=0 with an increasing first order transmission angle.

Figure 10:
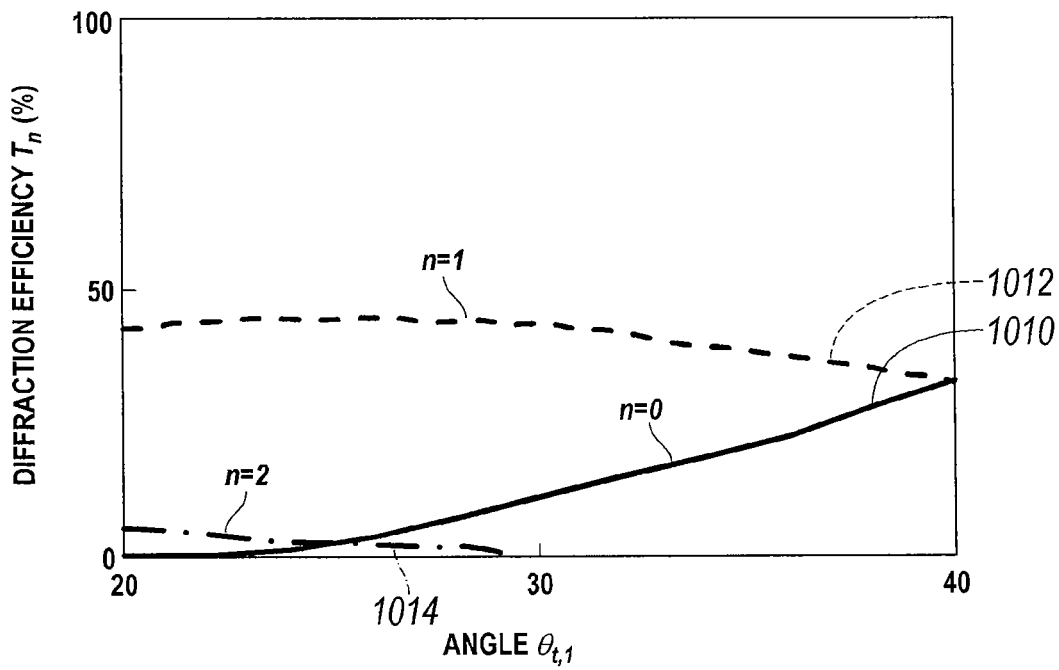
FIG. 10 is a graph illustrating the diffraction efficiency for the zero, first, and second order transmission with respect to the angle of the first order transmission.

FIG. 10 is a graph of the diffraction efficiency for each order of transmission relative to the angle of the first order of transmission. Line 1010 is the diffraction efficiency of the zero order transmission according to the angle of the first order transmission. Line 1012 is the diffraction efficiency of the first order transmission based on the angle of the first order of transmission. Further, line 1014 is the diffraction efficiency of the second order transmission according to the angle of the first order of transmission. As can be understood from this figure, the light transmitted in the normal direction to the grating increases as the angle of the first order transmission increases.

FIG. 11 is a graph illustrating the difference of amplitude contribution to the zero order transmission between the zero mode and the first or second mode with respect to the fill factor of the grating. In addition, the transmission of light may be analyzed for s-polarized and p-polarized light as well. Line 1110 is the amplitude difference between the zero mode and first mode that contribute to the zero order transmission for p-polarization. Line 1112 is the amplitude difference between the zero and second mode that contribute to the zero order transmission for p-polarization. As such, line 1110 is illustrated between a fill factor of 0 and 0.25, while line 1112 is illustrated above 0.25 fill factor. Further, line 1114 is the amplitude difference between the zero mode and first mode contribution to the zero order transmission for the s-polarization. Line 1116 is the amplitude difference between the zero and second mode contribution to the zero order transmission for s-polarization. A detailed review of FIG. 11 illustrates that the minimum amplitude difference for s-polarization is a fill factor of 0.25 where the minimum amplitude difference for p-polarization is at approximately 0.34. Accordingly, a point may be calculated to provide the smallest amplitude difference for both s and p-polarization simultaneously. Here, a fill factor of 0.34 may be selected. The selected fill factor may be calculated based on an average or a weighted average, although other methods may be used. For example, in this case the fill factor with the minimum average of $A_{d,m=0-2,n=0}$ (S) and $A_{d,m=0-2,n=0}$ (P) may be used.

Figure 12:
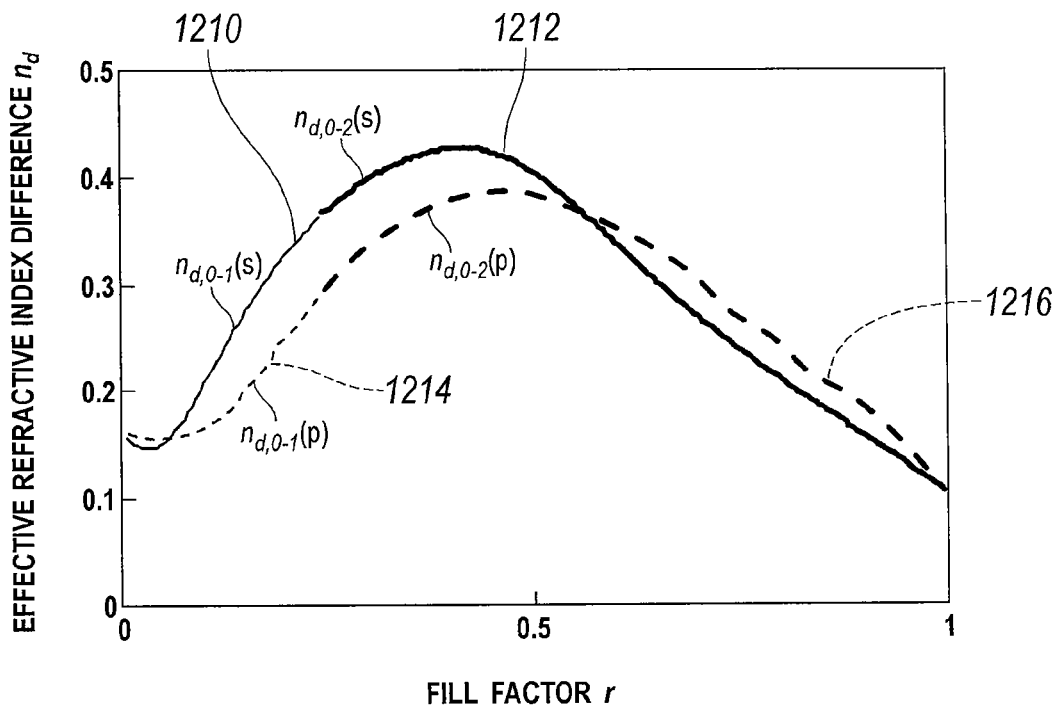
FIG. 12 is a graph illustrating the effective refractive index difference and the fill factor of the grating.

Now referring to FIG. 12, a graph of the effective refractive index difference with respect to the fill factor is provided. Line 1210 is the effective refractive index difference between the zero and first order transmissions for s-polarization. Line 1212 is the effective refractive index difference between the zero and second order transmissions for s-polarization. Line 1214 is the effective refractive index difference for the zero and first order transmissions for p-polarization, while line 1216 is the effective refractive index difference between the zero and second order transmissions for p-polarization. Again, the first order transmission is shown below a fill factor of 0.25 for s and p-polarizations, while the second order transmission is used for fill factors above 0.25. Effective refractive index difference shows a close value for s and p-polarizations at the fill factor of 0.34, although they are not exactly the same value. An average value of the effective refractive indexes for s and p-polarization at a fill factor of 0.34 corresponds to a grating height of about 1.3λ.

FIG. 13 illustrates the diffraction efficiency with regard to the height of the grating. Line 1310 is the diffraction efficiency for the zero order transmission for p-polarization. Line 1312 is the diffraction efficiency for the first order p-polarization. Line 1314 is the diffraction efficiency for the second order transmission for p-polarization with respect to grating height. Line 1316 is the diffraction efficiency for the zero order transmission for s-polarization with respect to grating height. Line 1318 is the diffraction efficiency for the first order transmission with respect to grating height for s-polarization. Line 1320 is the diffraction efficiency for the second order transmission for s-polarization with respect to grating height. This result is provided for a period of 1.84λ and a fill factor of 0.34 to provide minimum amplitude difference. Further, it is helpful to analyze this graph at a grating height of 1.3λ corresponding to the average of the effective refractive index difference. This may also correspond to the minimum average diffraction efficiency for the zero order transmission of s and p-polarization. Accordingly, the diffraction efficiency of the zero order transmission for the s-polarization is 2.4%. The diffraction efficiency for the first order transmission for s-polarization is 40.8%, while the second order transmission for s-polarization is only 6.7%. Similar results are obtained for p-polarization. The diffraction efficiency of the zero order transmission for p-polarization is 2.5%. The first order diffraction efficiency for the first order transmission is 45.3%. Further, the diffraction efficiency for the second order transmission is only 2.4%.

Figure 14:
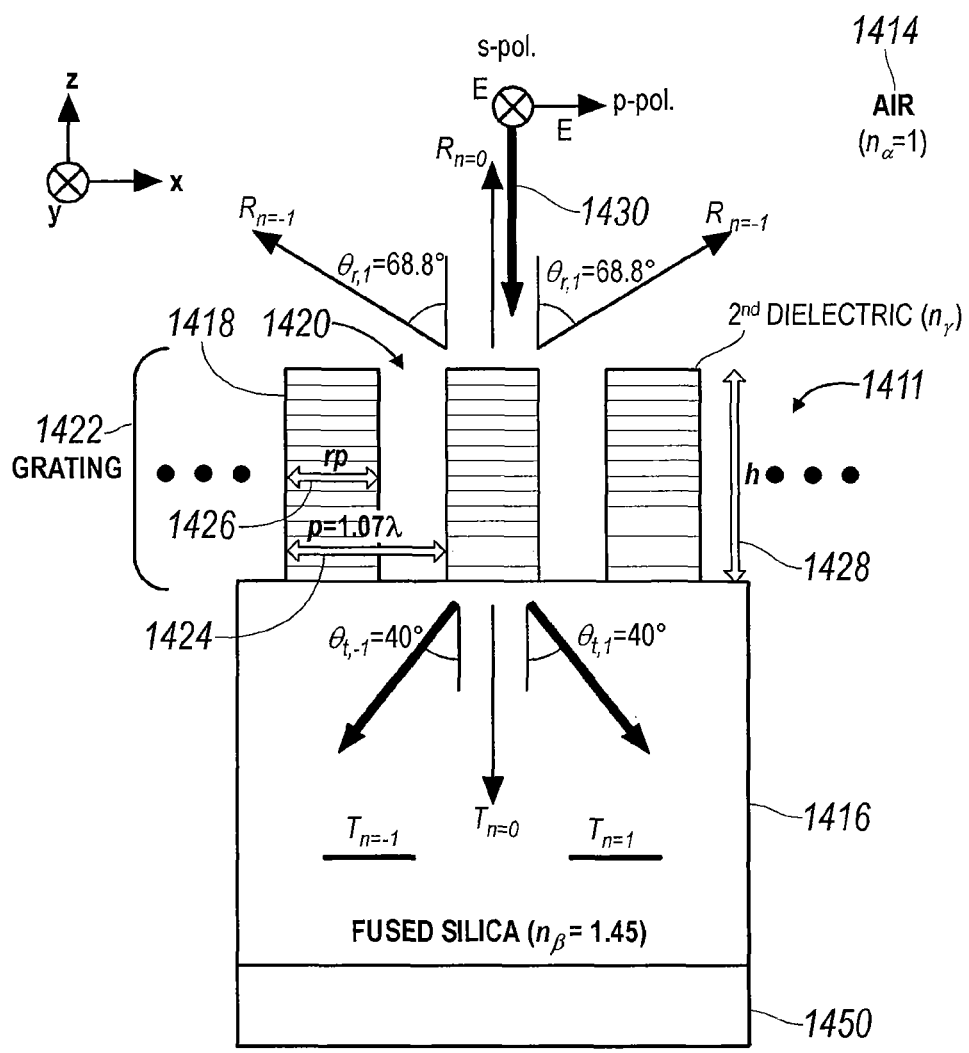
FIG. 14 is a side view of one embodiment of a grating having a 40 degree first order transmission.

FIG. 14 illustrates a grating with a first order transmission angle of 40 degrees or greater. The transmission grating 1411 may have a base 1416 of fused silica and protrusions 1418 formed of a dielectric material. The protrusions 1418 may form a dielectric to air interface. As such, air surrounds the protrusions 1418 and is denoted by reference number 1414. The protrusions 1418 form grooves 1420 located between each protrusion 1418. The grooves 1420 may be filled with air 1414. The grating layer 1422 diffracts light directed towards the transmission grating 1411 from a light source into various diffraction modes.

Light may be provided to the transmission grating 1411, as denoted by arrow 1430. The light 1430 is provided from an angle generally normal to the grating surface. In addition, the light 1430 may comprise various light polarizations. When the light 1430 interacts with the grating layer 1422, the incident light 1430 will form reflective components denoted by R and transmissive components denoted by T.

The resulting characteristics of the reflective and transmissive components are a factor of the refractive index (n) of the material, the period (p) of the grating, the fill factor (r) of the grating, and the height (h) of the grating. The period of the transmission grating 1411 is denoted by reference numeral 1424. The fill factor (r) is denoted by reference numeral 1426. The height (h) of the grating is the distance from the top of the protrusion 1418 to the bottom of the groove 1420, which is denoted by reference numeral 1428. In one embodiment, the grooves 1420 and protrusions 1418 may be formed as right angles to result in a rectangular grating. (i.e. having rectangular grooves and protrusions) However, as one would readily understand, the grooves 1420 and protrusions 1418 may not form exact right angles and various profiles may be used along the edge of the protrusions 1418.

For a solar cell assembly, an absorption layer 1450 may be coupled to the base 1416. As such, the base 1416 may adjoin or be formed on the absorption layer 1450 creating a direct interface to transfer the light energy from the grating 1411 to the absorption layer 1450. Further, another grating having similar properties to grating 1411 may be coupled to the opposite side of the absorption layer 1450 thereby redirecting light transmitted toward the opposite side of the absorption layer horizontally within the absorption layer 1450.

Figure 15:
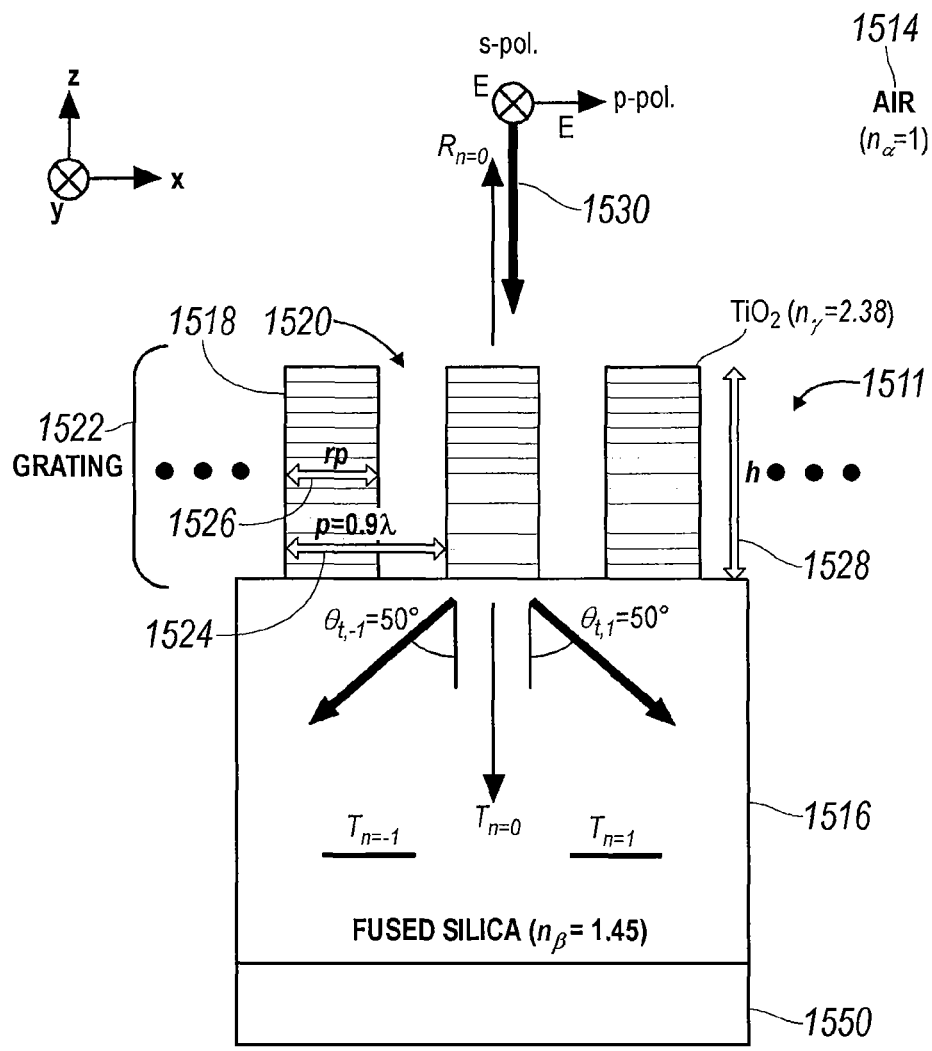
FIG. 15 is a side view of one embodiment of a grating having a 50 degree first order transmission.

FIG. 15 illustrates a grating with a first order transmission angle of about 50 degrees. The transmission grating 1511 may have a base 1516 of fused silica and protrusions 1518 formed of a $TiO_2$. The protrusions 1518 may form a $TiO_2$ to air interface. As such, air surrounds the protrusions 1518 and is denoted by reference number 1514. The protrusions 1518 form grooves 1520 located between each protrusion 1518. The grooves 1520 may be filled with air 1514. The grating layer 1522 diffracts light directed towards the transmission grating 1511 from a light source into various diffraction modes.

Light may be provided to the transmission grating 1511, as denoted by arrow 1530. The light 1530 is provided from an angle generally normal to the grating surface. In addition, the light 1530 may comprise various light polarizations. When the light 1530 interacts with the grating layer 1522, the incident light 1530 will form reflective components denoted by R and transmissive components denoted by T.

The resulting characteristics of the reflective and transmissive components are a factor of the refractive index (n) of the material, the period (p) of the grating, the fill factor (r) of the grating, and the height (h) of the grating. The period of the transmission grating 1511 is denoted by reference numeral 1524. The fill factor (r) is denoted by reference numeral 1526. The height (h) of the grating is the distance from the top of the protrusion 1518 to the bottom of the groove 1520, which is denoted by reference numeral 1528. In one embodiment, the grooves 1520 and protrusions 1518 may be formed as right angles to result in a rectangular grating. (i.e. having rectangular grooves and protrusions) However, as one would readily understand, the grooves 1520 and protrusions 1518 may not form exact right angles and various profiles may be used along the edge of the protrusions 1518.

For a solar cell assembly, an absorption layer 1550 may be coupled to the base 1516. As such, the base 1516 may adjoin or be formed on the absorption layer 1550 creating a direct interface to transfer the light energy from the grating 1511 to the absorption layer 1550. Further, another grating having similar properties to grating 1511 may be coupled to the opposite side of the absorption layer 1550 thereby redirecting light transmitted toward the opposite side of the absorption layer horizontally within the absorption layer 1550.

Figure 16:
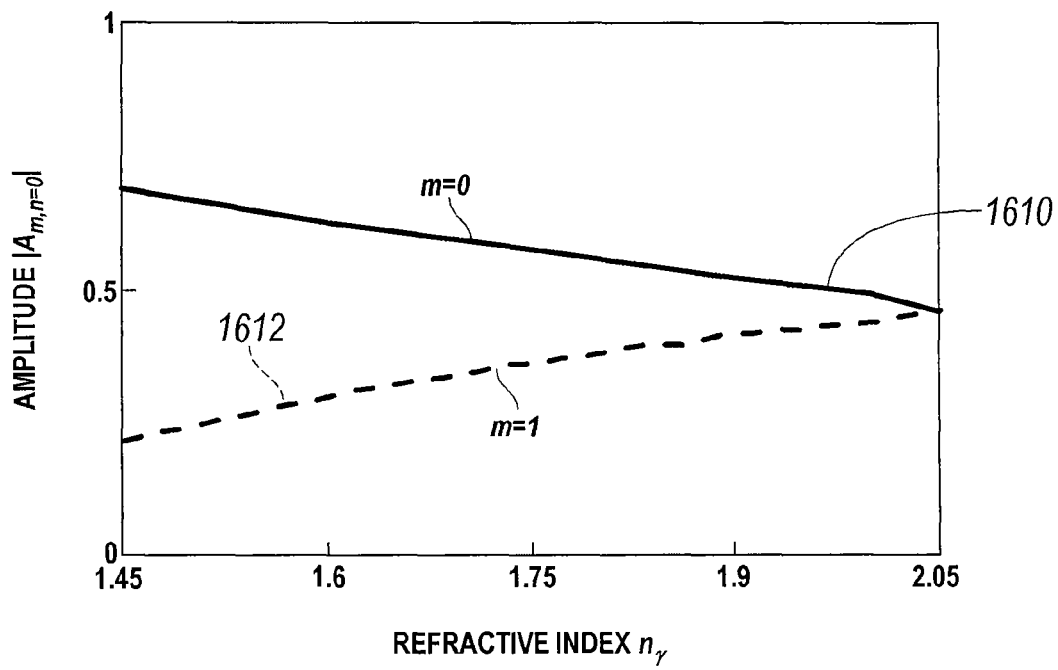
FIG. 16 is a graph illustrating the amplitude contribution for each mode to the zero order transmission with respect to refractive index.

FIG. 16 illustrates a graph of the amplitude of mode 1 and mode 0 with respect to the refractive index for the grating shown in FIG. 14. Line 1610 is the amplitude of mode 0 with respect to the refractive index. Line 1612 is the amplitude of mode 1 with respect to the refractive index. The minimum amplitude of m=0 decreases as the refractive index increases. The maximum amplitude of m=1 increases as the refractive index increases. This implies that light received at an angle normal to the grating (n=0) can be better suppressed by increasing the refractive index, thereby resulting is a small amplitude difference between mode 0 and mode 1.

Figure 17:
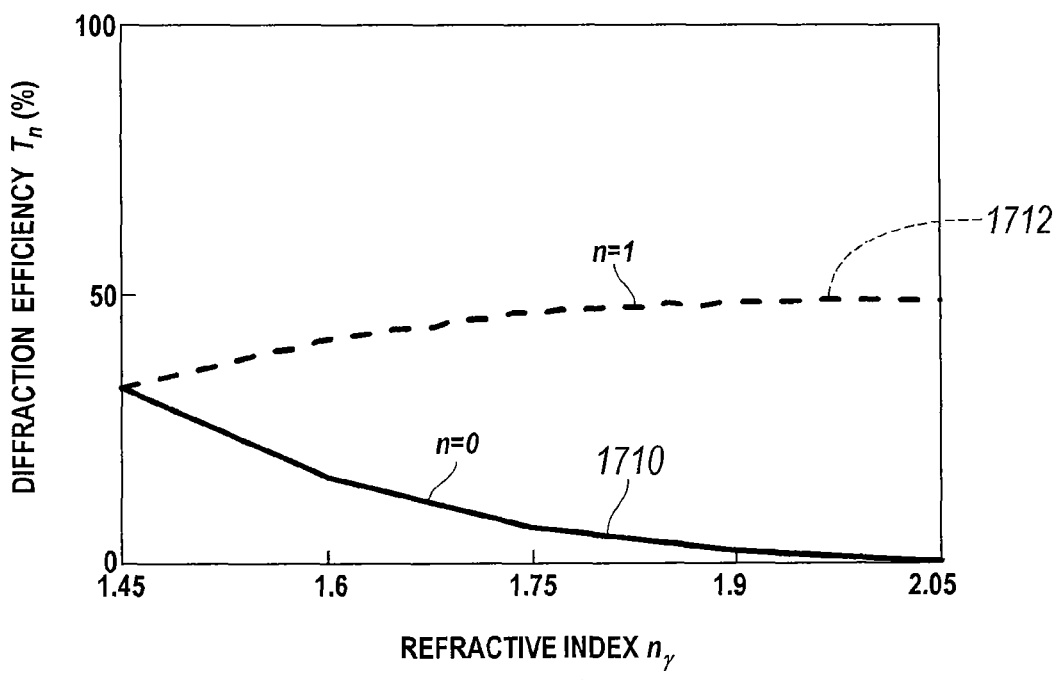
FIG. 17 is a graph illustrating the diffraction efficiency for the zero and first order transmission with respect to refractive index.

FIG. 17 provides a graph illustrating the diffraction efficiency with respect to refractive index of the zero order transmission (normal to the grating) and the first order transmission for the grating in FIG. 14. Line 1710 is the diffraction efficiency with respect to the refractive index for the zero order transmission (normal to the grating). Line 1712 is the diffraction efficiency with respect to the refractive index for the first order transmission (40 degrees for the grating in FIG. 14). As can be noted from the graph the diffraction efficiency of the zero order transmission decreases as the refractive index increases. This is a result of mode 0 and mode 1 having nearly equal amplitudes with a 180 degree phase shift.

Figure 18:
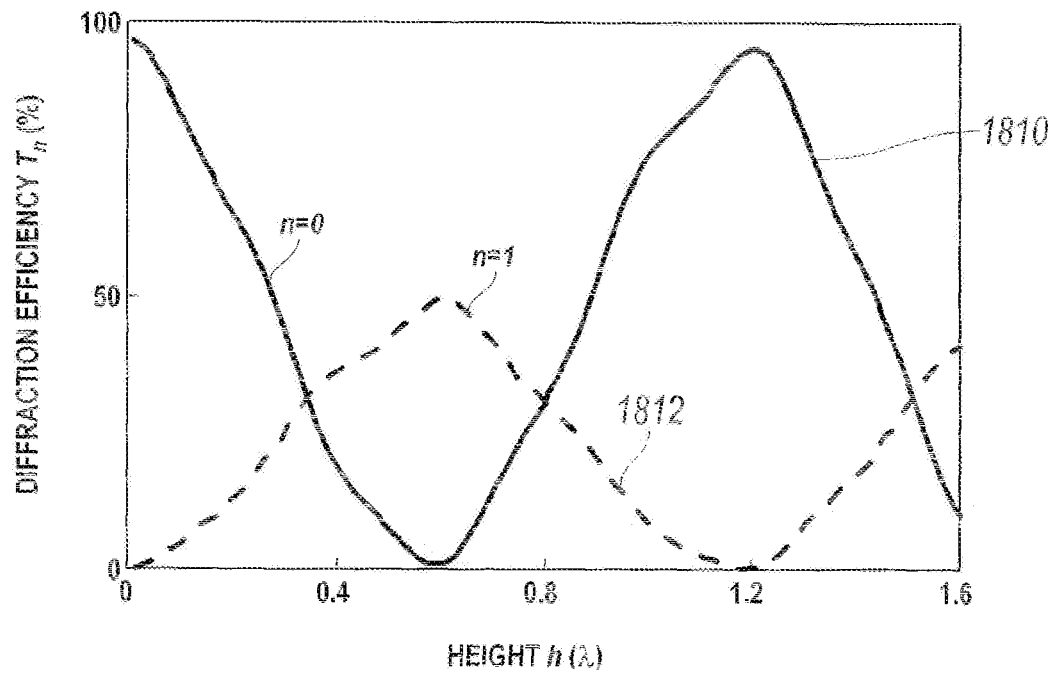
FIG. 18 is a graph illustrating the diffraction efficiency for the zero and first order transmission with respect to grating height for the grating in FIG. 14.

FIG. 18 provides a graph illustrating the diffraction efficiency with respect to the grating height for the zero order transmission and the first order transmission for the grating in FIG. 14. Line 1810 is the zero order transmission with respect the grating height. Line 1812 is the first order transmission with respect to the grating height. As the first order transmission peaks, the zero order transmission has a diffraction efficiency near zero. Both the zero and first order transmission oscillate, but they are out of phase by 180 degrees. This result is provided for a refractive index of $n_y$=2, a period of p=1.07λ, a fill factor r=0.22, and grating height of h=0.59λ. In this configuration the transmission efficiency of the zero order transmission is $T_{n=0}$=0.9% at $θ_{t,0}$=0 degrees. In addition, the first order transmission is $T_{n=1}(T_{n=-1}$=48.8% at an angle of $θ_{t,1}=(θ_{t,-1})$=40 degrees.

Figure 19:
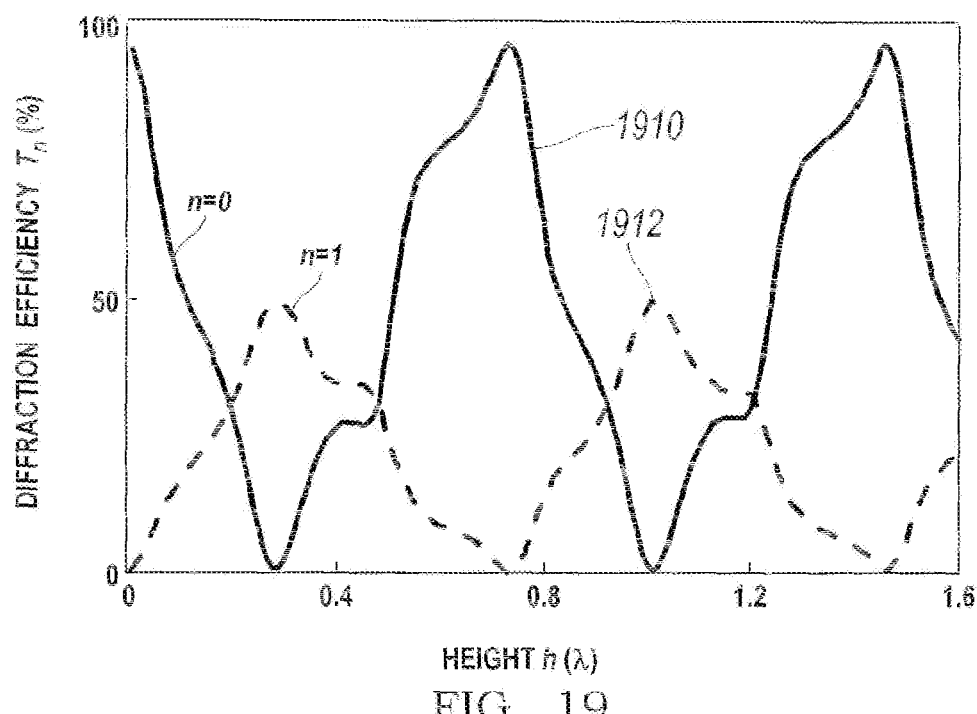
FIG. 19 is a graph illustrating the diffraction efficiency for the zero and first order transmission with respect to grating height for the grating in FIG. 15.

Further, FIG. 19 provides a graph illustrating the diffraction efficiency with respect to the grating height for the zero order transmission and the first order transmission for the grating in FIG. 15. Line 1910 is the zero order transmission with respect the grating height. Line 1912 is the first order transmission with respect to the grating height. As the first order transmission peaks the zero order transmission has a diffraction efficiency near zero. Both the zero and first order transmission oscillate but are out of phase by 180 degrees. This result is provided for a refractive index of $n_y$=2.38 ($TiO_2$ at 600 nm), a period of p=0.9λ, a fill factor r=0.29, and grating height of h=0.28λ. However, a grating period p=0.87λ–0.93λ, a fill factor r=0.24–0.34, and a grating height h=0.23λ–0.33λ may also be used. In this configuration, the transmission efficiency of the zero order transmission is $T_{n=0}$=0.7% at $θ_{t,0}$=0 degrees. In addition, the first order transmission is $T_{n=1}(T_{n=-1}$=49.5% at an angle of $θ_{t,1}=(θ_{t,-1})$=50 degrees.

Figure 20:
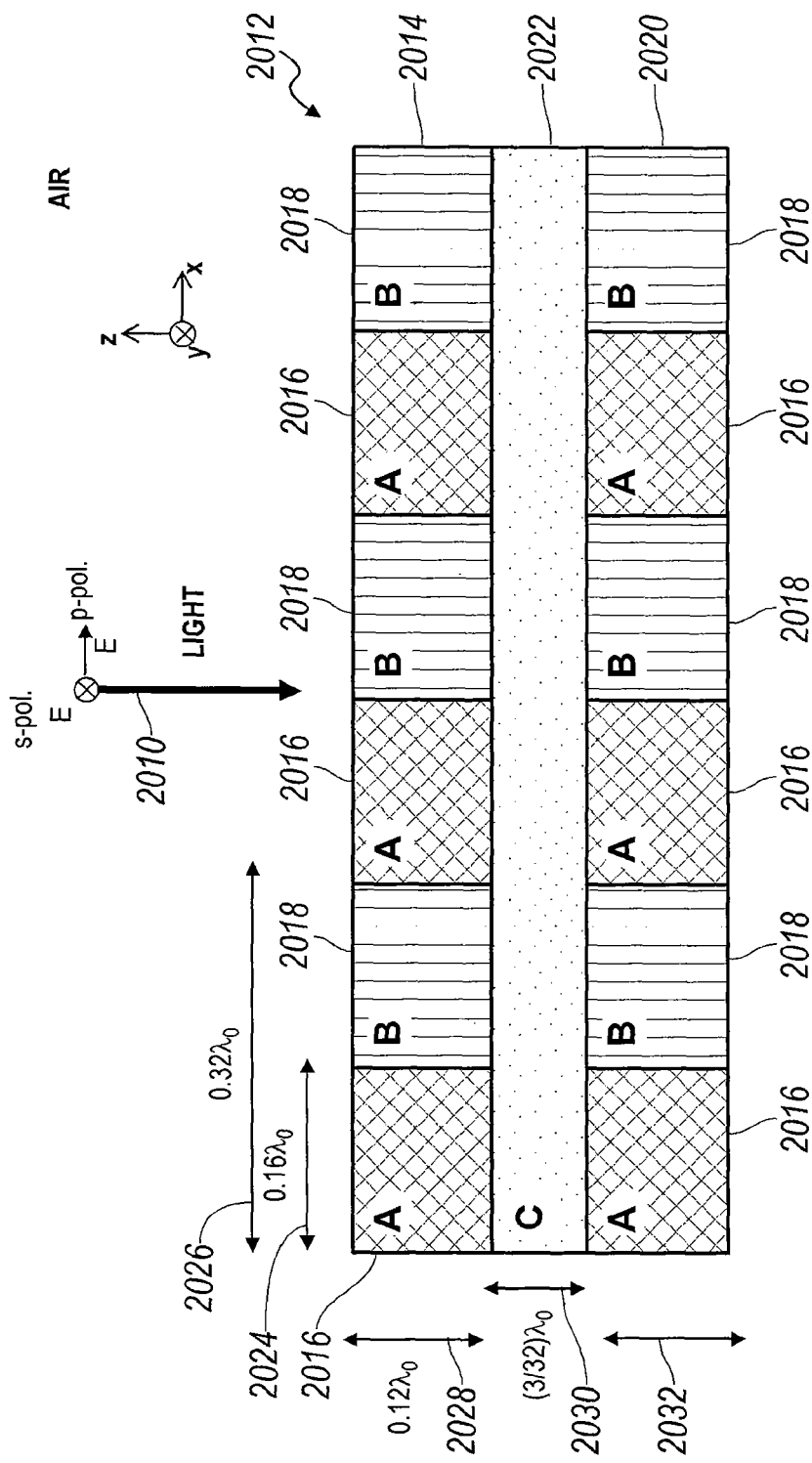
FIG. 20 is a side view of a solar cell assembly.

FIG. 20 illustrates one embodiment of a solar cell assembly 2012. The assembly 2012 includes a first grating layer 2014, an absorption layer 2022, and a second grating layer 2020. The absorption layer 2022 is sandwiched between the first grating layer 2014 and the second grating layer 2020. Light 2010, for example from the sun, is received onto the assembly 2012. Direct sun light is generally received normal to many surfaces, such as the tops of roofs or cars. However, light normal to the absorption layer 2022 is not absorbed with as much efficiency as light traveling in plane with the absorption layer 2022.

The first grating layer 2014 is made up of alternating portions first and second portions. The first portion 2016 may be a first lossless dielectric and the second portion 2018 may be a second lossless dielectric. The first lossless dielectric may have a permittivity $∈_{a,r}$ of about 2.25. The second lossless dielectric may have a permittivity $∈_{b,r}$ of about 6.25. In one embodiment the first portion 2016 may be fused silica and the second portion 2018 may be $TiO_2$. Further, the absorption layer may have a permittivity $∈_{c,r}$ of about 16+j0.1. As discussed above, the first lossless dielectric alternates with the second lossless dielectric across the grating layer 2014. The alternating portions diffract the light in the same manner as the ridges and grooves of the grating in FIGS. 1 and 2. Each of the portions of first and second lossless dielectric may have a width of about 0.16λ, as denoted by arrow 2024. As such, the period of the grating is 0.32λ, as denoted by arrow 2026. Further, the thickness of the first grating layer 2014 and the second grating layer 2020 may be 0.12λ, as denoted by arrows 2028 and 2032, respectively. Further, the thickness of the absorption layer 2022 may be ³⁄₃₂λ, as denoted by arrow 2030. When the absorption layer has a half guided wavelength ((½)*(λ/4)=(⅛)λ), it has resonance. As such, a thin absorption layer with a thickness less than (⅛)λ may be preferable. Further, adding the lossless dielectric at the top and bottom sides (for example the second lossless dielectric 2018 with $\in_{b,r}$=6.25 and thickness of 0.04λ may also provide resonance). The results of this can be seen in FIGS. 25 and 26.

Figure 25:
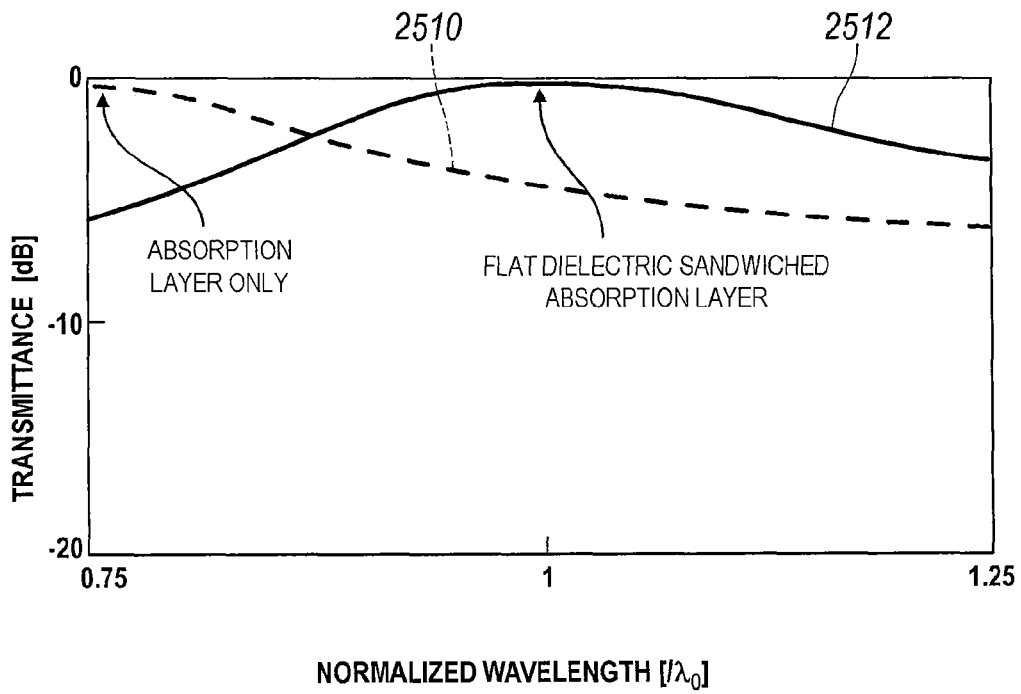
FIG. 25 is a graph illustrating the transmittance with respect to normalized wavelength.
Figure 26:
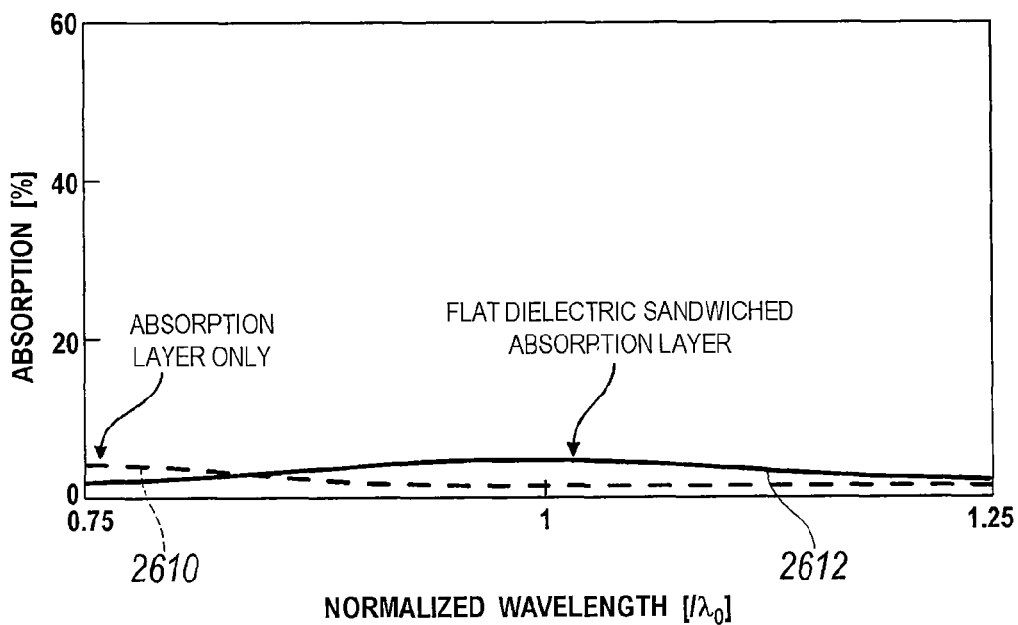
FIG. 26 is a graph illustrating the absorption with respect to normalized wavelength.

FIG. 25 shows a graph of transmittance with respect to normalized wavelength for an absorption layer having a thickness less that (⅛)λ and an absorption layer sandwiched between two uniform dielectric layers. Line 2510 illustrates the transmittance with respect to normalized wavelength for an absorption layer by itself having a thickness less that (⅛)λ. Line 2512 illustrates the transmittance with respect to normalized wavelength for an absorption layer sandwiched between two uniform dielectric layers (for example $\in_{b,r}$=6.25 and thickness of 0.04λ). Further, FIG. 26 shows a graph of absorption with respect to normalized wavelength for an absorption layer having a thickness less than ⅛λ (e.g. 3/32λ) and an absorption layer sandwiched between two dielectric layers. Line 2610 illustrates the absorption with respect to normalized wavelength for an absorption layer by itself having a thickness less than ⅛λ. Line 2612 illustrates the absorption with respect to normalized wavelength for an absorption layer sandwiched between two dielectric layers (for example $\in_{b,r}$=6.25 and thickness of 0.04λ).

The absorption layer by itself has a resonance at 0.75λ. that corresponds to a half guided wavelength. The dielectric layer sandwiching method provides a resonance at λ. For both cases, the absorption peaks with about 4% at resonance.

Figure 21:
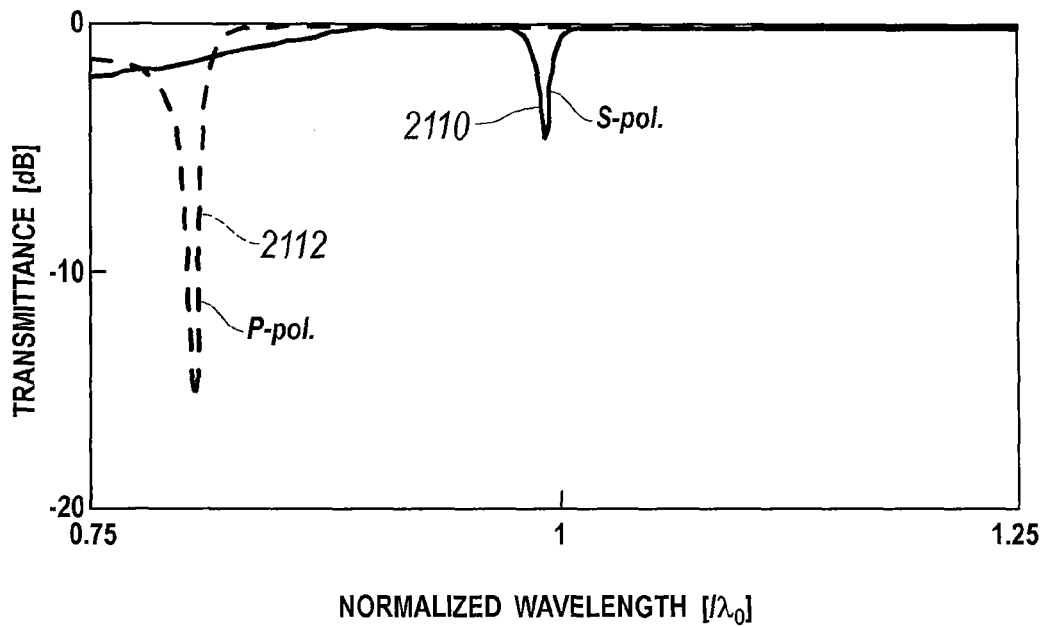
FIG. 21 is a graph illustrating the transmittance for s-polarization and p-polarization with respect to normalized wavelength.
Figure 22:
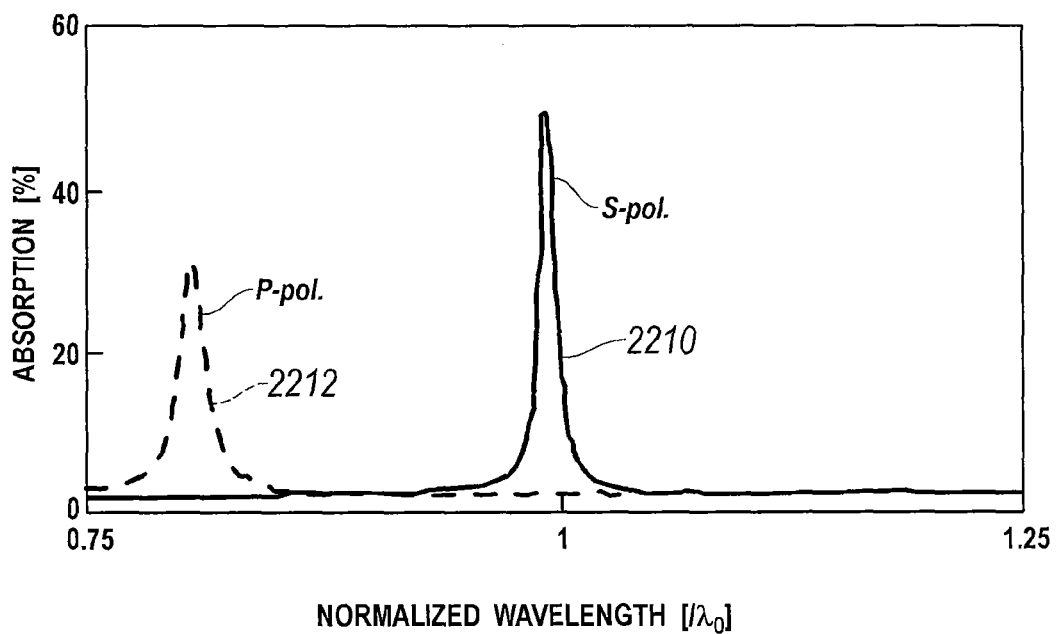
FIG. 22 is a graph illustrating the absorption for s-polarization and p-polarization with respect to normalized wavelength.

FIG. 21 is a graph illustrating the transmittance of the s polarization and p-polarization with respect to the normalized wavelength of incident light for the assembly in FIG. 20. Line 2110 is the transmittance of S-polarized light with respect to the normalized wavelength. Line 2112 is the transmittance of P-polarized light with respect to the normalized wavelength. Similarly, FIG. 22 is a graph illustrating the absorption of the s polarization and p-polarization with respect to the normalized wavelength for the assembly in FIG. 20. Line 2210 is the absorption of S-polarized light with respect to the normalized wavelength. Line 2212 is the absorption of P-polarized light with respect to the normalized wavelength. As can be seen, strong absorption peaks are present for both S-polarization and P-polarization. S-polarization has an absorption peak of about 50% around λ. P-polarization has an absorption peak of about 30% around 0.8λ.

Figure 23:
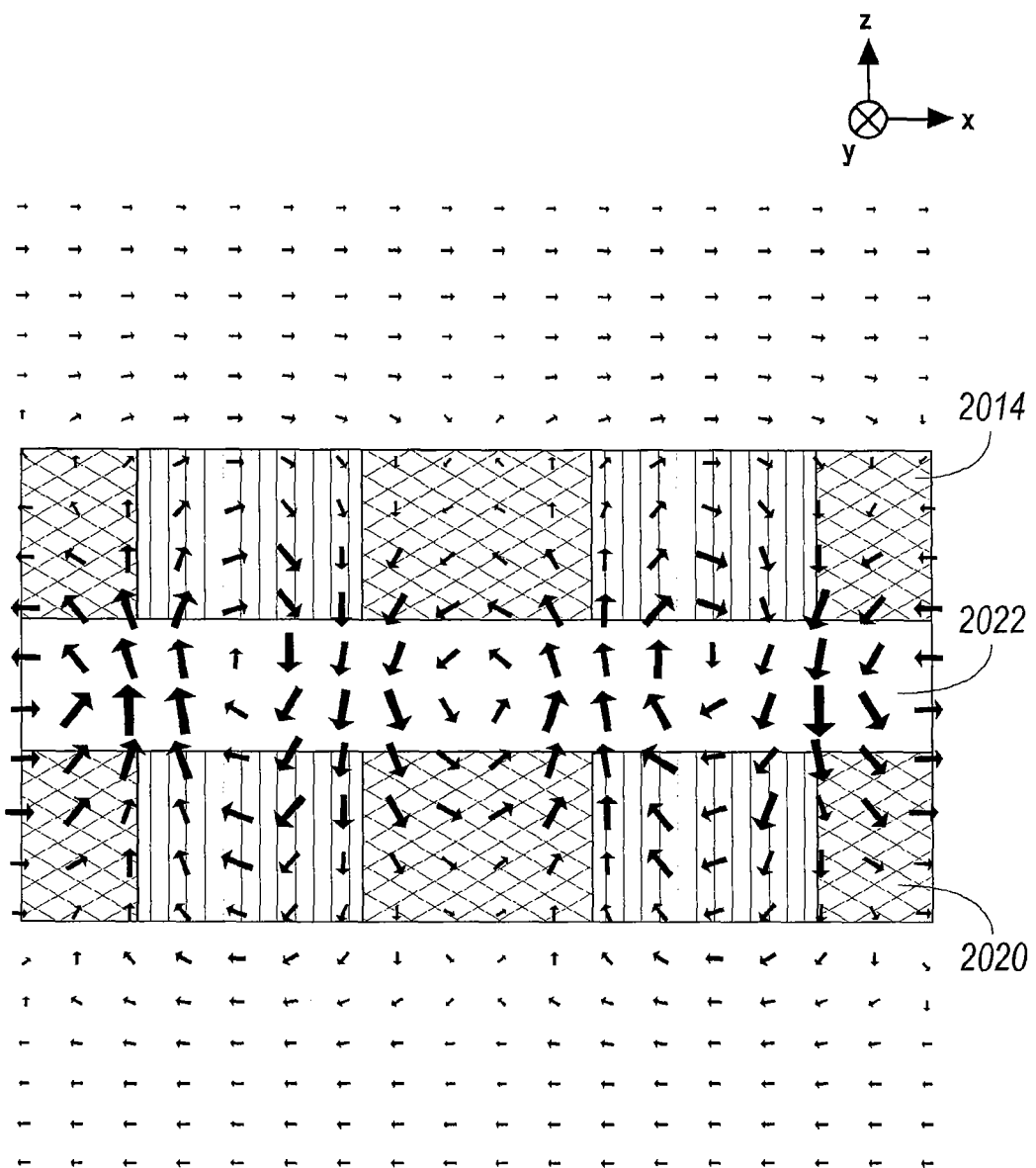
FIG. 23 is a side view of a solar cell assembly illustrating the magnetic field for s-polarization.

FIG. 23 is a side view of the assembly in FIG. 20 illustrating the magnetic field for S-polarization for two periods. The magnetic field is shown for λ. The orientation of each arrow represents the localized direction of the magnetic field, while the size of the arrow represents the magnitude of the magnetic field. A strong magnetic field is observed in the absorption layer 2022, due to resonance.

Figure 24:
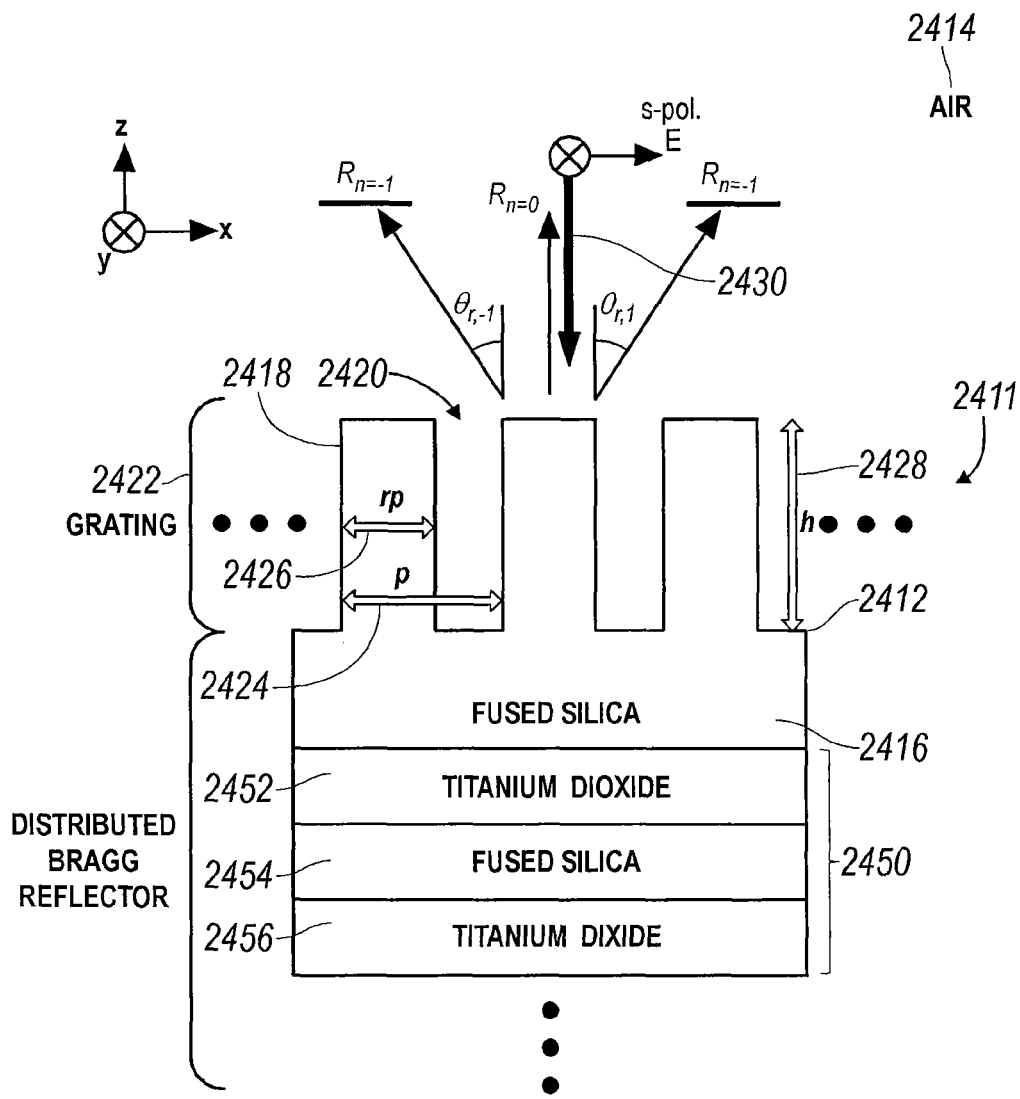
FIG. 24 is a side view of a solar cell assembly including a grating and a reflector.

FIG. 24 provides one embodiment of a grating assembly that may be used on the opposite side of an absorption layer from the incident light. As such, any of the aforementioned transmission gratings may be placed on the side of the absorption layer receiving the light and the grating described below may be placed on the opposite side of the absorption layer. The reflective grating 2411 may be a fused silica transmission grating with a silica to air interface. As such, air surrounds a silica structure 2412 and is denoted by reference number 2414. The silica structure 2412 includes a base 2416 of solid fused silica. Fused silica is very transparent and transmits a very broad bandwidth of light. Further, fused silica offers a very stable material that can be used over a wide range of temperature conditions. In addition, fused silica gratings may be easily etched to provide the grating properties required for many applications. Fused silica has an index of refraction of about 1.45 in contrast to air with an index of refraction of about 1. The symbol $n_\alpha$ is used to denote the refraction index of air and $n_\beta$ is used to denote the refraction index for fused silica.

Protrusions 2418 extend from and are integral with the base 2416. Being integral with the base 2416 the protrusions 2418 are also formed of fused silica. The protrusions 2418 form grooves 2420 located between each protrusion 2418. The grooves 2420 may be filled with air 2414, thereby providing an air fused silica interface across the grating layer 2422. The grating layer 2422 diffracts light directed towards the reflection grating 2411 from a light source into various diffraction modes.

Light may be provided to the grating 2411, as denoted by arrow 2430. The light 2430 is provided from an angle generally normal to the grating surface. In addition, the light 2430 may comprise various light polarizations. For example, the incident light may comprise components that are s-polarized and p-polarized. When the light 2430 interacts with the grating layer 2422, the incident light 2430 will form reflective components denoted by R.

The resulting characteristics of the reflective and transmissive components are a factor of the refractive index (n) of the material, the period (p) of the grating, the fill factor (r) of the grating, and the height (h) of the grating. The period of the grating is the distance from the start of one groove to the start of the next groove. The period of the transmission grating 2411 is denoted by reference numeral 2424. The fill factor (r) can be defined as the ratio of the ridge width or groove width to the period of the grating, which is denoted by reference numeral 2426. The height (h) of the grating is the distance from the top of the protrusion 2418 to the bottom of the groove 2420, which is denoted by reference numeral 2428. In one embodiment, the grooves 2420 and protrusions 2418 may be formed as right angles to result in a rectangular grating. (i.e. having rectangular grooves and protrusions) However, as one would readily understand, the grooves 2420 and protrusions 2418 may not form exact right angles and various profiles may be used along the edge of the protrusions 2418. As such, the definition for the fill factor (r) or grating height (h) may be slightly modified depending on the shape of the projections 2418 and grooves 2420. As such, these values may be determined based on the center of gravity of the projections 2418 and grooves 2420.

In addition, the base 2416 of fused silica may be formed on top of a sandwich structure 2450. The sandwich structure 2450 includes a first layer 2452 of titanium dioxide, a layer of fused silica 2454, and a second layer 2456 of titanium dioxide. The first layer 2452 being located between the base 2416 and the layer of fused silica 2454. The layer of fused silica 2454 being located between the first layer 2452 and the second layer 2456. The base 2416 and the sandwich structure 2450 forming a distributed Bragg reflector located below the grating.

Figure 27:
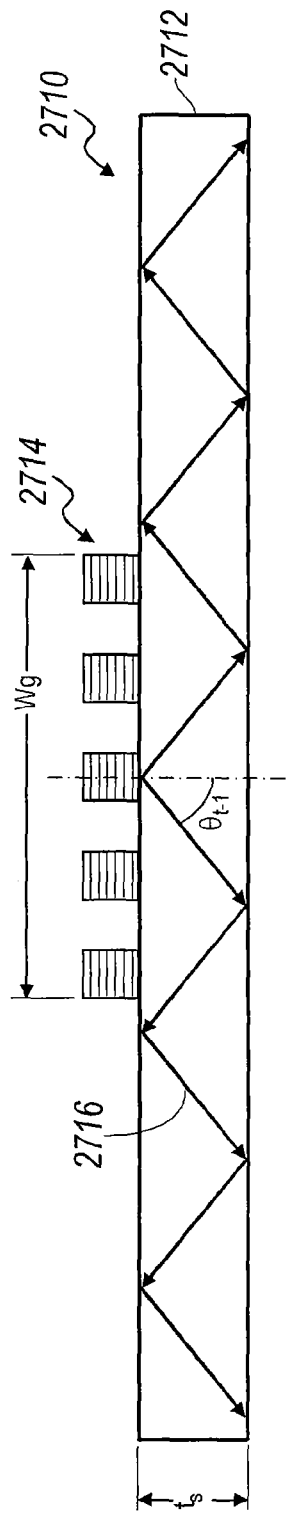
FIG. 27 is a side view of a coupler.
Figure 28:
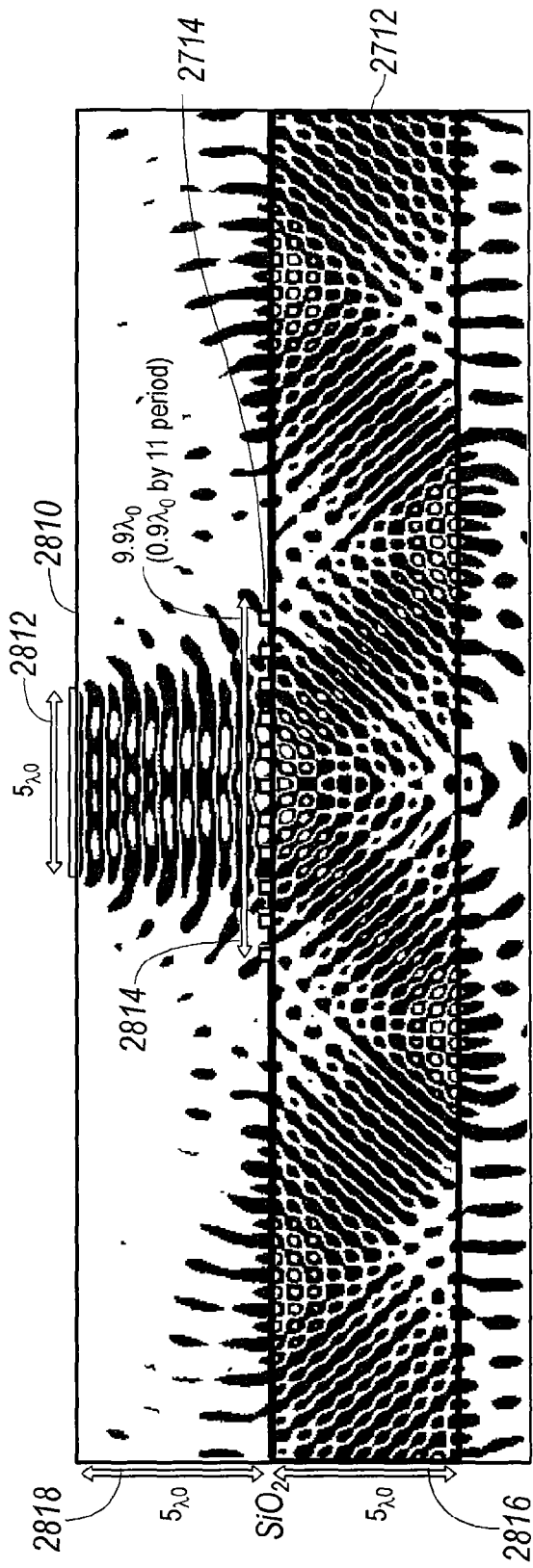
FIG. 28 is a -side view of a coupler illustrating the wave propagation of the light.

FIGS. 27 and 28 illustrate another embodiment of a grating. This embodiment may be used for a solar cell, but may also be used for coupling. In this embodiment, the assembly 2710 includes a substrate 2712 and a grating 2714. The grating may correspond to any of the previously described gratings, for example the grating of FIG. 15. In this instance, the grating width is selected to be smaller than the distance where the light is reflected back to the top surface of the substrate. This can be better understood in reference to arrows 2716 that represent the resulting direction of light travel through the substrate due to the grating diffraction. The light is primarily directed to the first order transmission at a 50 degree angle. If the angle is over about 43.6 degrees, the light energy will be internally reflected and propagate horizontally within the substrate. Therefore, arrows 2716 show light bouncing between the top and bottom surface of the substrate as it propagates horizontally.

Further, it is helpful to note that for a coupling application the grating width can be important. For example, if the light diffracted by the grating reflects internally within the substrate and returns to the grating, the unabsorbed portion of the light may exit the substrate due to the grating. As such, the grating width is selected to be smaller than twice the distance required for the internally reflected light to travel from the top surface to the bottom surface and back to the top surface. More specifically, the width of the grating $w_g$ is less than twice the thickness of the substrate $t_s$ times the tangent of the first order transmission angle $\theta_{t,1}$. ($w_g < 2t_s (\tan(\theta_{t,1}))$).

One specific example is shown in FIG. 28. The width of the beam 2810 provided to the assembly is 5λ, as denoted by line 2812. The width of the grating is selected to be 9.9λ (0.9λ by 11 periods). Where the beam travel is 5λ, as denoted by line 2818 and the substrate height is 5λ, as denoted by line 2816. If the grating were allowed to extend beyond the width where the internally reflected light reaches the top surface, the grating would allow much of the light to exit the substrate thereby greatly reducing absorption efficiency.

As a person skilled in the art will readily appreciate, the above description is meant as an illustration of the principles this application. This description is not intended to limit the scope or application of the invention in that the invention is susceptible to modification, variation and change, without departing from spirit of the invention, as defined in the following claims.

We claim:

1. A grating structure comprised of alternating ridges and grooves, the ridges and grooves being rectangular, and the fill factor and grating height being selected to suppress the zero order transmission to near 0 wherein the alternating ridges and grooves have a grating period p=0.9λ, a fill factor r=0.29, a grating height h=0.28λ, where λ is a design wavelength of the grating structure.

2. The grating structure according to claim 1, wherein the grating structure is in communication with a base and the refractive index of the grating is higher than refractive index of the base.

3. The grating structure according to claim 2, wherein the angle of the first order transmission is from 30 degrees to 60 degrees.

4. The grating structure according to claim 3, wherein the angle of the first order transmission is about 50 degrees, where the grating is Titanium dioxide and the base is fused silica.

5. The grating structure according to claim 1, wherein λ is about 450 nm for enhancement of blue color.

6. The grating structure according to claim 1, wherein λ is about 550 nm for enhancement of green color.

7. The grating structure according to claim 1, wherein λ is about 700 nm for enhancement of red color.

8. The grating structure according to claim 1, wherein λ is about 1550 nm for a coupling application.

9. The grating structure according to claim 1, wherein the grating structure is in communication with a fused silica base, the fused silica base having alternating ridges and grooves, the ridges and grooves forming a fused silica to air interface.

10. The grating structure according to claim 1, further comprising a substrate coupled to the ridges and grooves, wherein a width of the grating being less than twice the horizontal distance required for light traveling at the first order transmission angle to travel from a top surface of the substrate to the bottom surface of the substrate and reflect back to the top surface of the substrate.

11. The grating structure according to claim 10, wherein the width of the grating being less than twice the thickness of the substrate times the tangent of the first order transmission angle.

12. The grating structure according to claim 1, wherein a zero mode amplitude contribution and a first mode amplitude contribution of the zero order transmission are approximately the same magnitude and 180 degrees out of phase.

13. A grating structure comprised of alternating ridges and grooves, the ridges and grooves being rectangular, and the fill factor and grating height being selected to suppress the zero order transmission to near 0%, wherein the alternating ridges and grooves have a grating period p=1.84λ, a fill factor r=0.34, a grating height h=1.3λ, where λ is a design wavelength of the grating structure.

14. The grating structure according to claim 13, wherein a zero mode amplitude contribution and a first mode amplitude contribution of the zero order transmission are approximately the same magnitude and 180 degrees out of phase.

15. A grating structure comprised of alternating ridges and grooves, the ridges and grooves being rectangular, and the fill factor and grating height being selected to suppress the zero order transmission to near 0%, wherein the alternating ridges and grooves have a grating period p=1.84λ , a fill factor r=0.25, a grating height h=1.35λ , where λ is a design wavelength of the grating structure.

16. The grating structure according to claim 15, wherein a zero mode amplitude contribution and a first mode amplitude contribution of the zero order transmission are approximately the same magnitude and 180 degrees out of phase.

\* \* \* \* \*

UNITED STATES PATENT AND TRADEMARK OFFICE
CERTIFICATE OF CORRECTION

| | | |
|---|---|---|
| PATENT NO. | : 8,675,279 B2 | Page 1 of 1 |
| APPLICATION NO. | : 12/638334 | |
| DATED | : March 18, 2014 | |
| INVENTOR(S) | : Iizuka et al. | |

It is certified that error appears in the above-identified patent and that said Letters Patent is hereby corrected as shown below:

On the Title Page:

Item (12) and Item (75) Inventors
Change "Hideo Iizuki" to --Hideo Iizuka--

On the Title Page:

The first or sole Notice should read --

Subject to any disclaimer, the term of this patent is extended or adjusted under 35 U.S.C. 154(b) by 682 days.

Signed and Sealed this
Fifth Day of May, 2015

Michelle K. Lee
*Director of the United States Patent and Trademark Office*